US006118688A

United States Patent [19]

Hirano et al.

[11] Patent Number: 6,118,688

[45] Date of Patent: Sep. 12, 2000

[54] FERROELECTRIC MEMORY DEVICE AND METHOD FOR DRIVING IT

[75] Inventors: Hiroshige Hirano, Nara; Koji Asari, Aichi, both of Japan

[73] Assignee: Matsushita Electronics Corporation, Osaka, Japan

[21] Appl. No.: 09/147,462

[22] PCT Filed: Jun. 4, 1998

[86] PCT No.: PCT/JP98/02464

§ 371 Date: Dec. 30, 1998

§ 102(e) Date: Dec. 30, 1998

[87] PCT Pub. No.: WO98/56003

PCT Pub. Date: Dec. 10, 1998

[30] Foreign Application Priority Data

Jun. 5, 1997 [JP] Japan .................................... 9-147479

[51] Int. Cl.[7] .................................................... G11C 11/22

[52] U.S. Cl. ...................... 365/145; 365/189.09; 365/205

[58] Field of Search .................................... 365/145, 149, 365/205, 207, 189.09

[56] References Cited

U.S. PATENT DOCUMENTS

| | | | |
|---|---|---|---|
| 4,873,664 | 10/1989 | Eaton, Jr. | 365/145 |
| 4,888,773 | 12/1989 | Arlington et al. | 371/40.2 |
| 5,392,234 | 2/1995 | Hirano et al. | 365/145 |
| 5,532,953 | 7/1996 | Ruesch et al. | 365/145 |
| 5,546,342 | 8/1996 | Nakame et al. | 365/189.01 |
| 5,798,964 | 8/1998 | Shimizu et al. | 365/145 |
| 5,847,989 | 12/1998 | Seyyedy | 365/145 |
| 5,889,696 | 3/1999 | Kawakubo et al. | 365/145 |

FOREIGN PATENT DOCUMENTS

| | | |
|---|---|---|
| 3-283176 | 12/1991 | Japan . |
| 4-228191 | 8/1992 | Japan . |
| 5-198194 | 8/1993 | Japan . |
| 6-223583 | 8/1994 | Japan . |
| 6-342597 | 12/1994 | Japan . |
| 8-185694 | 7/1996 | Japan . |
| 8-263989 | 10/1996 | Japan . |
| 9-102191 | 4/1997 | Japan . |
| 9-139090 | 5/1997 | Japan . |

*Primary Examiner*—Richard Elms
*Assistant Examiner*—Hien Nguyen
*Attorney, Agent, or Firm*—Eric J. Robinson; Nixon Peabody LLP

[57] ABSTRACT

A ferroelectric memory device having a memory cell internally provided with first and second ferroelectric capacitors, with first and second memory cell transistors interposed between first and second bit lines (BL, /BL) and the data accumulation nodes (SN, /SN) of the first and second ferroelectric capacitors, respectively, and with a cell plate line (CP) connected to the cell plate of each of the first and second ferroelectric capacitors is controlled by the following procedures. After L data is written in the memory cell capacitor during the period between times t12 and t13, H data is written in the memory cell capacitor by control operation during the period between the time t13 and a time t14. At the time t14, the voltage on a word line (WL) is switched to L to turn OFF the first memory cell transistor, while the writing of H data in the first ferroelectric capacitor is continued by using residual charge. A high-speed write operation is accomplished by increasing the amount of charge retained by the ferroelectric memory device.

26 Claims, 19 Drawing Sheets

WL
CP
BL/BL
SN/SN
BP2
SAE
t11
t12
t13
t14
t15
L DATA WRITE PERIOD
PERIOD FOR H DATA WRITING BY CONTROL OPERATION
PERIOD FOR H DATA WRITING BY USING RESIDUAL CHARGE

BL
SN
/SN
/BL
WL
CP
11
12
13
14
1
BP2
21
22
25
23
24
26
/BP1
2
VDD
34
35
36
31
32
SAE
37
39
VSS
38
3

VSS
39
38
37
SANC
41
42
35
32
36
34
31
VDD
SAE
3
21
22
BP2
2
CP
13
14
11
12
WL
1
BL
SN
/SN
/BL

BL
/BL
SN
/SN
WL
CP
11
12
13
14
1
BP2
/BP1
21
22
23
24
25
26
2
SAE
VDD
SANC
VSS
31
32
34
35
36
37
38
39
41
42
3

WL
CP
CPC
BL/BL
SN/SN
/BP2
SAE
t60
t61
t62
t63
t64
t65
t66
t67
t68
t69

BL
/BL
SN
/SN
WL1
WL2
CP1
CP2
CPV1
CPV1
11
12
13
14
C91
C92
1
BP2
21
22
2
RWL2
RWL1
45
46
VREF
4
VDD
VSS
SAE
31
32
34
35
36
37
38
39
3

SENSE AMP CIRCUIT
SA
3
SAE
43
44
VR
4
DL
REFERENCE VOLTAGE
SUPPLY CIRCUIT
SW RC
51
CR
5
SW WC
61
CW
6
SW1
10
CP
SN
13
WL
11
1
BP2
21
2
BL

FERROELECTRIC MEMORY DEVICE AND METHOD FOR DRIVING IT

TECHNICAL FIELD

The present invention relates to memory devices embedded in electronic equipment and the like and, more particularly, to a ferroelectric memory device having a memory cell provided with a ferroelectric capacitor and to a method of driving the same.

BACKGROUND ART

In recent years, there has been proposed a ferroelectric memory device having a memory cell provided with a capacitor in which a capacitive film made of a ferroelectric material is disposed, resulting in a non-volatile memory device. As shown in FIG. 19, the ferroelectric material is such a material that, as an electric field applied thereto is increased gradually from 0, the amount of polarization caused therein also increases to reach a maximum value at point A but, as the electric field is reduced in reverse, the amount of polarization decreases slowly without retracing the previous transition process and does not reach 0 even when the electric field is reduced to 0, which causes a residual polarization indicated at point B. If a negative electric field is applied to the ferroelectric material and reduced gradually to 0, a residual polarization indicated at the point D is observed. One characteristic of the ferroelectric material is a so-called hysteresis curve or loop which causes a residual polarization responsive to the intensity and polarity of the electric field applied previously to the ferroelectric material.

By internally providing a memory cell with a ferroelectric capacitor composed of a ferroelectric film sandwiched between two conductor films and using, as stored data, the residual polarization of the ferroelectric film responsive to the polarity and magnitude of a signal voltage, the stored data can be preserved without being volatilized so that a so-called non-volatile memory device is implemented.

For example, U.S. Pat. No. 4,873,664 discloses the following two types of ferroelectric memory devices.

In the non-volatile memory device of the first type, each memory cell for storing 1 bit is composed of one transistor and one ferroelectric capacitor (1T1C). In this case, one dummy memory cell (reference cell) is provided for every 256 main memory cells (normal cells).

In the non-volatile memory device of the second type, each memory cell for storing 1 bit is composed of two transistors and two ferroelectric capacitors (2T2C) without using a dummy memory cell.

There is also a non-volatile memory device in which each memory cell for storing 1 bit is composed of two transistors and one ferroelectric capacitor (2T1C), as disclosed for example in U.S. Pat. No. 4,888,733.

Known examples of the ferroelectric material used in the ferroelectric capacitor include $KNO_3$, $PbLa_2O_3$—$ZrO_2$—$TiO_2$, and $PbTiO_3$—$PbZrO_3$. There is also disclosed a ferroelectric material with extremely reduced fatigue compared with $PbTiO_3$—$PbZrO_3$ in PCT International Publication WO 93/12542.

A description will be given to the operation of a conventional 2T2C ferroelectric memory device with reference to FIGS. 17 and 18.

FIG. 17 is an electric circuit diagram showing the structure of the conventional 2T2C ferroelectric memory device, in which a reference numeral 1 denotes a memory cell; 2 denotes a bit-line voltage control circuit; 3 denotes a sense amp circuit; BL, /BL denote bit lines; SN, /SN denote data accumulation nodes; WL denotes a word line; CP denotes a cell plate line; BP2 denotes a bit-line voltage control signal line; and SAE denotes a sense-amp control signal line.

In the memory cell circuit 1, memory cell transistors 11, 12 have respective drains connected to the bit lines BL, /BL, respective sources connected to the data accumulation nodes SN, /SN, and respective gates connected to the word line W1. Memory cell capacitors 13, 14 each having a ferroelectric film are interposed between the respective data accumulation nodes SN, /SN and the cell plate line CP.

In the bit-line voltage control circuit 2, respective NMOS transistors 21 and 22 for voltage control are interposed between the bit lines BL, /BL and the ground. The bit-line voltage control signal line BP2 is connected to each of the gates of the NMOS transistors 21 and 22.

In the sense amp circuit 3, first and second inverters 31, 32 are connected in series to the sense amp signal line SAE. The first inverter 31 has an output connected to the gate of a PMOS transistor 34 for applying a drive pulse. Two PMOS transistors 35 and 36 constituting a differential sense amplifier are disposed between the bit lines BL, /BL. The PMOS transistor 34 has a source connected to the common drain of the PMOS transistors 35, 36, while having a drain connected to a power-source voltage supply terminal. The second inverter 32 has an output connected to the gate of an NMOS transistor 39 for applying a drive pulse. Two NMOS transistors 37, 38 constituting another differential sense amplifier are disposed between the bit lines BL, /BL. The NMOS transistor 39 has a drain connected to the common source of the NMOS transistors 37, 38, while having a source connected to the ground. Briefly, the MOS transistors 34 and 39 are operated in response to a control signal from the sense amp signal line SAE to apply an activation pulse to the two differential sense amplifiers which amplify a voltage difference (data) between the bit lines BL, /BL.

FIG. 18 is a timing chart illustrating a write operation performed in the aforesaid 2T2C ferroelectric memory device.

First, when a logic signal L is supplied to the bit-line voltage control signal line BP2 at a time t201, the NMOS transistors 21, 22 are turned OFF in the bit-line voltage control circuit 2 to stop the precharging of the bit lines BL, /BL to the ground voltage VSS. On the other hand, data to be written from the outside is transferred to the bit lines BL, /BL and a logic signal H is supplied to the sense-amp control signal line SAE to operate the sense amp circuit 3, so that the data on the bit lines BL, /BL is latched thereby. By way of example, data on the bit lines BL, /BL is defined to be "1" when a voltage on the bit line BL is H and a voltage on the bit line /BL is L, while it is defined to be "0" when the voltage on the bit line BL is L and the voltage on the bit line /BL is H. When data "1" is transferred, therefore, the voltage on the bit line BL becomes equal to the power-source voltage VDD by turning ON the PMOS transistor 35 and turning OFF the PMOS transistor 36. By contrast, the voltage on the bit line /BL becomes the ground voltage VSS by turning ON the NMOS transistor 38 and turning OFF the NMOS transistor 37. When data "0" is transferred to the bit lines BL, /BL, on the other hand, the voltage on the bit line BL becomes equal to the ground voltage VSS, while the voltage on the bit line /BL becomes equal to the power-source voltage VDD.

Next, when the logic signal H is supplied to the word line WL at a time t202, the memory cell transistors 11, 12 are turned ON so that respective voltages at the data accumulation nodes SN, /SN become equal to respective voltages on the bit lines BL, /BL. When the logic signal H is supplied simultaneously to the cell plate line CP, the L data is written in one of the memory cell capacitors 13, 14 each having the ferroelectric film (e.g., the state indicated at point C in FIG. 19).

Next, when the logic signal L is supplied to the cell plate line CP with the logic signal H supplied to the word line WL at a time t203, H data is written in the other of the memory cell capacitors 13, 14 (the state indicated at point A in FIG. 19). As a result, the L data has a residual polarization indicated at point D in FIG. 19.

At that time, for example, the data “1” is stored in the memory cell with the H data written in the memory cell capacitor 13 and with the L data written in the memory cell capacitor 14, while the data “0” is stored in the memory cell with the L data written in the memory cell capacitor 13 and with the H data written in the memory cell capacitor 14. In other words, complementary data is stored.

Next, when the logic signal L is supplied to the sense-amp control signal line SAE at a time t204, the operation of the sense amp circuit 3 is stopped so that the voltage difference between the bit lines BL, /BL becomes approximately zero. When the logic signal H is supplied to the bit-line voltage control signal line BP2, the respective voltages on the bit lines BL, /BL become equal to the ground voltage VSS, while the respective voltages at the data accumulation nodes SN, /SN also become equal to the ground voltage VSS. In this state, no charge remains in the two conductor films of the memory cell capacitor with the ferroelectric film sandwiched therebetween, since the voltage on the cell plate line CP is also the ground voltage VSS. At that time, the L data has a residual polarization indicated at point D in FIG. 19, while the H data has the residual polarization indicated at point B in FIG. 19.

Next, when the logic signal L is supplied to the word line WL at a time t205, the memory cell transistors 11, 12 are turned OFF, whereby the write operation is completed.

In the foregoing write operation, the period between the times t202 and t203 is the period for the writing of L data in the memory cell capacitor and the period between the times t203 and t204 is the period for the writing of H data in the memory cell capacitor.

SUBJECT MATTERS TO BE SOLVE BY THE INVENTION

Thus, in the conventional ferroelectric memory device, the writing of data in the memory cell capacitors is performed only during the period during which the word line is selected. Since the data to be written is complementary data consisting of H data and L data, the writing of the data requires the period between the times t203 and t204 in addition to the period between the times t202 and t203. Such a write time presents substantially no problem when the power-source voltage is high. However, the magnitudes of the residual polarizations indicated at points B and D in FIG. 19 are reduced under low-voltage and low-temperature conditions, since the magnitude of the polarization of the ferroelectric film is smaller under low-voltage and low-temperature conditions than under high-voltage and high-temperature conditions. To minimize the amount of reduction in residual polarization, it is necessary to sufficiently elongate the period between the times t202 and t204. This is because the magnitudes of the residual polarizations indicated at points B and D in FIG. 19 are smaller as the speed of change of the electric field is higher so that the data retention property of the ferroelectric film deteriorates when the write time is reduced. It follows therefore that a high-speed write operation cannot be performed with a low voltage by means of such a ferroelectric memory device, which presents an obstacle to the implementation of higher-performance ferroelectric memory device.

In the aforesaid conventional memory device, moreover, the power-source voltage VDD or ground voltage VSS is applied to the memory cell capacitor formed of the ferroelectric film via the bit lines and the sense amplifier, so that a potential difference between the both terminals of the ferroelectric film of the memory cell capacitor becomes equal to the power-source voltage VDD, which may degrade reliability.

It is therefore a first object of the present invention to implement a ferroelectric memory device having an excellent data retaining ability wherein the time required to write data in the ferroelectric memory can be reduced.

A second object of the present invention is to provide a ferroelectric memory device with high reliability wherein the ferroelectric film deteriorates to a lesser degree.

DISCLOSURE OF THE INVENTION

First, a description will be given to the idea and basic principle of means for solving the first problem encountered by the present invention.

In the conventional write operation, the polarization of the ferroelectric capacitor can be inverted only when a voltage is applied between the both electrodes of the ferroelectric capacitor. However, the polarization inverting operation proved to be time-consuming under low-voltage and low-temperature conditions, as stated previously. To solve the problem, the write operation may be performed over such an elongated time as to allow the polarization inverting operation to be completed therewithin. In accordance with the method, however, a high-speed operation cannot be performed.

In view of the foregoing, the present inventors have devised a ferroelectric memory device adopting a method in which a write operation to a ferroelectric capacitor inside the memory device is performed over an extended period of time, while the time required for a write operation performed from outside the memory device is shortened. Specifically, a voltage is applied between the both electrodes of the ferroelectric capacitor and the resulting charge remains between the both electrodes of the ferroelectric capacitor. In accordance with the method, the polarization inverting operation is performed continuously till the charge in the ferroelectric capacitor dissipates through junction leakage or leakage between the both electrodes of the ferroelectric capacitor. The time required by the charge to dissipate is 100 msec even at a high temperature, which is sufficiently long for the polarization inverting operation.

In short, the polarization of the ferroelectric capacitor is inverted by using parasitic capacitance connected in parallel to the ferroelectric capacitor, such as the junction capacitance between the source/drain diffusion region of the transistor and a substrate and charge from an additional capacitor.

A fist ferroelectric memory device according to the present invention comprises: a memory cell; a bit line connected to the memory cell; a ferroelectric capacitor provided in the memory cell and composed of first and second electrodes and a ferroelectric film sandwiched between the first and second electrodes; a memory cell transistor provided in the memory cell to be interposed between the bit line and the first electrode of the ferroelectric capacitor; a cell plate line connected to the second electrode of the ferroelectric capacitor; and control means for stopping the supply of a voltage to each of the first and second electrodes with charge for polarizing the ferroelectric film remaining at the first and second electrodes of the ferroelectric capacitor.

The arrangement reduces time required for control and thereby allows a large polarization to occur in the ferroelectric capacitor. Accordingly, the ferroelectric memory device can operate at a high speed even under adverse conditions such as low-temperature and low-voltage conditions.

The first ferroelectric memory device may have a 1T1C configuration or a 2T1C configuration further comprising: another bit line connected to the memory cell; and another memory cell transistor interposed between the other bit line and the second electrode of the ferroelectric capacitor.

The first ferroelectric memory device may also have a 2T2C configuration further comprising: another bit line connected to the memory cell; another ferroelectric capacitor; and another memory cell transistor interposed between the other bit line and the other ferroelectric capacitor.

The control means turns OFF the memory cell transistor with a voltage on the bit line being higher than a voltage on the cell plate line and lower than a voltage obtained by adding a power-source voltage to the voltage on the cell plate line. This allows the write operation using residual charge to be continued.

In a 2T2C ferroelectric memory device, in particular, the control means can turn OFF the memory cell transistor with a voltage on the bit line being higher than a voltage on the cell plate line and lower than a voltage obtained by adding a power-source voltage to the voltage on the cell plate line and turns OFF the other memory cell transistor with a voltage on the other bit line being lower than the voltage on the cell plate line. In the case of controlling the voltage on the other bit line and the voltage on the cell plate line, the control means may lower the voltage on the cell plate line after turning OFF the other memory cell transistor or lower the voltage on the cell plate line after placing the other bit line in a floating state. Alternatively, the control means may turn OFF the other memory cell transistor with a voltage on the other bit line being lower than the voltage on the cell plate line by the value of a built-in voltage.

A second ferroelectric memory device comprises: a memory cell; a bit line connected to the memory cell; a ferroelectric capacitor provided in the memory cell and composed of first and second electrodes and a ferroelectric film sandwiched between the first and second electrodes; a memory cell transistor provided in the memory cell to be interposed between the bit line and the first electrode of the ferroelectric capacitor; a cell plate line connected to the second electrode of the ferroelectric capacitor; and a charge supply capacitor having first and second electrodes and a dielectric film sandwiched between the first and second electrodes, the first electrode of the charge supply capacitor and the first electrode of the ferroelectric capacitor being connected to each other to allow movement of charge therebetween.

The arrangement uses the charge supply capacitor to supply larger charge to the ferroelectric capacitor and thereby improves the retention property of the ferroelectric film.

The charge supply capacitor may be a normal capacitor of a MIM structure or a ferroelectric capacitor.

The second ferroelectric memory device may have a 1T1C configuration or a 2T1C configuration further comprising: another bit line connected to the memory cell; and another memory cell transistor interposed between the other bit line and the second electrode of the ferroelectric capacitor.

In addition, the second electrode of the charge supply capacitor may be configured to receive a fixed voltage.

The second ferroelectric memory device can further comprise control means for inverting the polarity of a voltage at the second electrode of the charge supply capacitor with the first electrode of the charge supply capacitor being connected to the first electrode of the ferroelectric capacitor.

The arrangement allows a polarization to occur in the ferroelectric film of the ferroelectric capacitor by using a higher voltage.

The ferroelectric second memory device is also applicable to a 2T2C configuration further comprising: a capacitor: and another charge supply capacitor having first and second electrodes and a dielectric film sandwiched between the first and second electrodes, the first electrode of the charge supply capacitor and the first electrode of the ferroelectric capacitor being connected to each other to allow movement of charge therebetween, the first electrode of the other charge supply capacitor and the first electrode of the other ferroelectric capacitor being connected to each other to allow movement of charge therebetween.

In the case of the 2T2C configuration, there may further be provided a common line connected to the second electrode of the charge supply capacitor and to the second electrode of the other charge supply capacitor or, alternatively, there may further be provided first and second lines connected to the respective second electrodes of the charge supply capacitor and the other charge supply capacitor.

In the case of providing the first and second lines, the first line is connected to the other bit line and the second line is connected to the bit line, while there may also be provided: a first switching transistor provided to intervene the first line; and a second switching transistor provided to intervene the first line.

The arrangement allows a polarization to occur in each ferroelectric film by using a higher voltage resulting from higher and lower voltages applied to two bit lines in a 2T2C ferroelectric memory device during writing, so that complementary data having an excellent retention property is stored therein.

The second ferroelectric memory device may further comprise a data line connected to the bit line such that the first electrode of the charge supply capacitor is connected to the data line and that a connection is provided between the first electrode of the charge supply capacitor and the first electrode of the ferroelectric capacitor during writing.

In the case where a large number of memory cells are connected to the bit line, the arrangement allows writing to each of the memory cells by using the common charge supply capacitor provided externally of the memory cells.

The second ferroelectric memory device may further comprise a capacitor for reading having first and second electrodes and a dielectric film sandwiched between the first and second electrodes such that the first electrode of the capacitor for reading is connected to the data line and that a connection is provided between the first electrode of the capacitor for reading and the first electrode of the ferroelectric capacitor during reading.

The second ferroelectric memory device may further comprise: a capacitor for reading having first and second electrodes and a ferroelectric film sandwiched between the first and second electrodes; and another data line connected to the first electrode of the capacitor for reading such that a connection is provided between the first electrode of the charge supply capacitor and the first electrode of the ferroelectric capacitor during writing and that a connection is provided between the first electrode of the capacitor for reading and the first electrode of the ferroelectric capacitor during reading.

Alternatively, the second ferroelectric memory device may be so constituted that the charge supply capacitor is connected to the first electrode of the ferroelectric capacitor during writing and that the charge supply capacitor is used as capacitance for adjusting the capacitance of the bit line during reading.

The arrangement provides a structure which does not require the provision of an additional capacitor for reading.

The second ferroelectric memory device may further comprise: a write buffer circuit connected to the data line and containing the charge supply capacitor; a data line for reading connected to the bit line via a transistor; and a sense amplifier circuit connected to the data line for reading. In this case, there may also be provided an additional capacitor for reading connected to the data line for reading.

The arrangement uses the buffer circuit to suppress a high stress from being applied to the ferroelectric film and provides a high-reliability ferroelectric memory device.

Preferably, the second ferroelectric memory device further comprises control means for stopping the supply of a voltage to each of the first and second electrodes with charge for polarizing the ferroelectric film remaining at the first and second electrodes of the ferroelectric capacitor.

The arrangement accomplishes the writing of data using larger residual charge.

A method of driving a ferroelectric memory device according to the present invention is a method of driving a ferroelectric memory device having a memory cell internally provided with a ferroelectric capacitor composed of first and second electrodes and a ferroelectric film sandwiched between the first and second electrodes and with a switching transistor connected to the first electrode of the ferroelectric capacitor, the method comprising: a first step of turning ON the switching transistor to provide an electric field for polarizing the ferroelectric film between the first and second electrodes of the ferroelectric capacitor via the switching transistor; and a second step of turning OFF the switching transistor with charge for providing the electric field for polarizing the ferroelectric film remaining at least one of the first and second electrodes.

In operating the ferroelectric memory device thus constituted, the method allows the polarization of the ferroelectric film to continue by using residual charge in the second step even after the completion of the write operation in the first step.

In the foregoing method of driving a ferroelectric memory device, the second step preferably includes causing the charge to remain such that an electric field less intense than and having the same polarity as the electric filed supplied to the ferroelectric film in the first step is supplied to the ferroelectric film.

In a 2T2C ferroelectric memory device further comprising: another ferroelectric capacitor disposed in the memory cell and composed of first and second electrodes and a ferroelectric film sandwiched between the first and second electrodes; and another switching transistor connected to the first electrode of the other ferroelectric capacitor, the first step may include applying to the first electrode of the ferroelectric capacitor a voltage higher than a voltage applied to the second electrode thereof and the second step may include turning OFF the switching transistor with the voltage higher than the voltage applied to the second electrode of the ferroelectric capacitor being applied to the first electrode thereof, while the method can further comprise the steps of: applying to the first electrode of the other ferroelectric capacitor a voltage lower than a voltage applied to the second electrode thereof; and turning OFF the other switching transistor with the voltage lower than the voltage applied to the second electrode of the other ferroelectric capacitor being applied to the first electrode thereof.

The method allows the writing of complementary data using residual charge.

BEST MODES FOR IMPLEMENTING THE INVENTION

Embodiment 1

Figure 1:
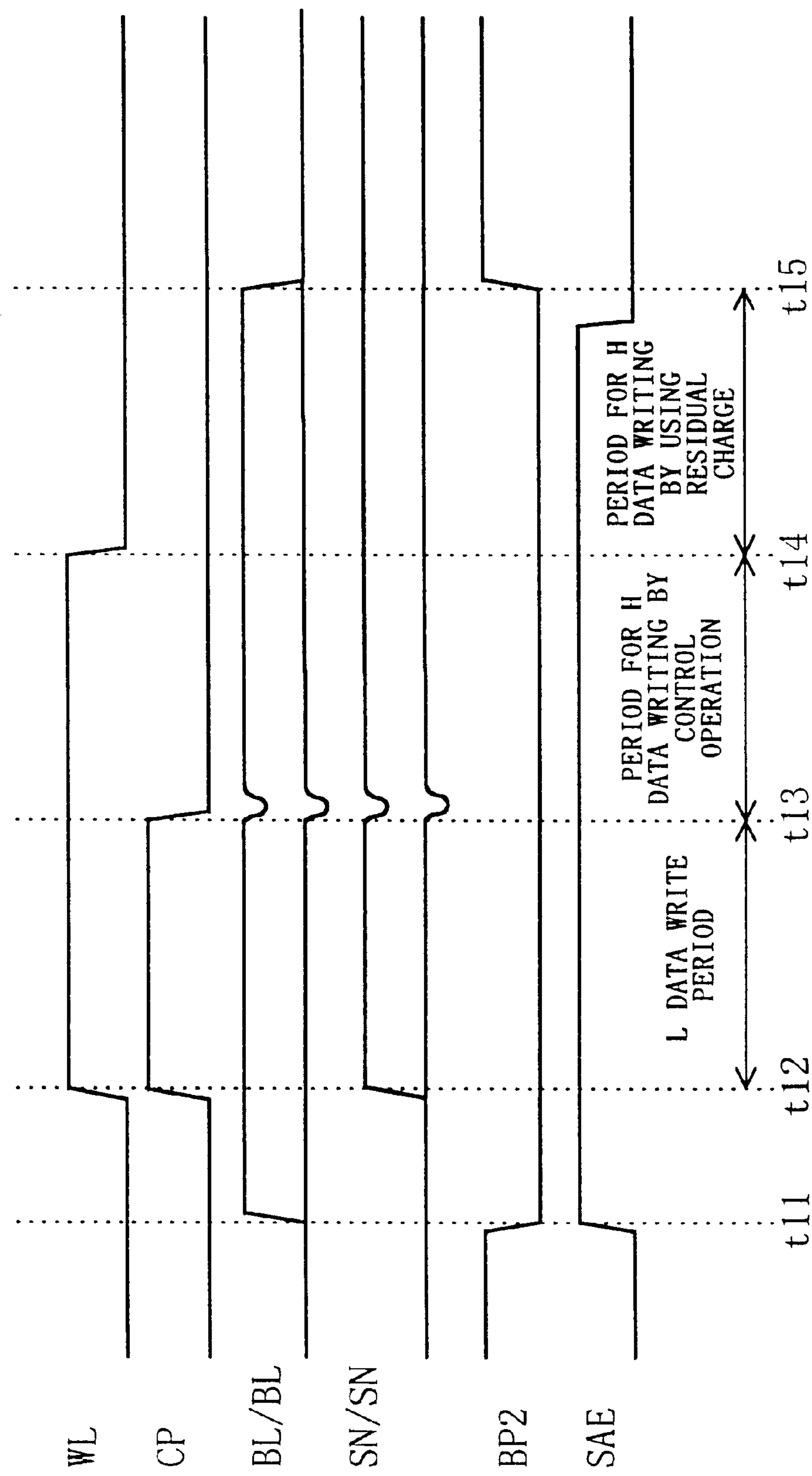
FIG. 1 is an operation timing chart for a ferroelectric memory device according to a first embodiment of the present invention.

A first embodiment of the present invention will be described. A ferroelectric memory device according to the present embodiment has a structure identical to that of the conventional ferroelectric memory device shown in FIG. 17 and is different only in operation timing therefrom. FIG. 1 is an operation timing chart illustrating a write operation performed in the ferroelectric memory device according to the present embodiment.

First, when a logic signal L is supplied to the bit-line voltage control signal line BP2 at a time t11, the NMOS transistors 21, 22 are turned OFF in the bit-line voltage control circuit 2 to stop the precharging of the bit lines BL, /BL to the ground voltage VSS. On the other hand, data to be written from the outside is transferred to the bit lines BL, /BL and a logic signal H is supplied to the sense-amp control signal line SAE to operate the sense amplifier circuit 3, so that the data on the bit lines BL, /BL is latched thereby.

Next, when the logic signal H is supplied to the word line WL at a time t12, the memory cell transistors 11, 12 are turned ON and respective voltages at the data accumulation nodes SN, /SN become equal to respective voltages on the bit lines BL, /BL. When the logic signal H is supplied simultaneously to the cell plate line CP, L data is written in one of the memory cell capacitors 13, 14 each having the ferroelectric film (e.g., the state indicated at point C in FIG. 19).

Figure 19:
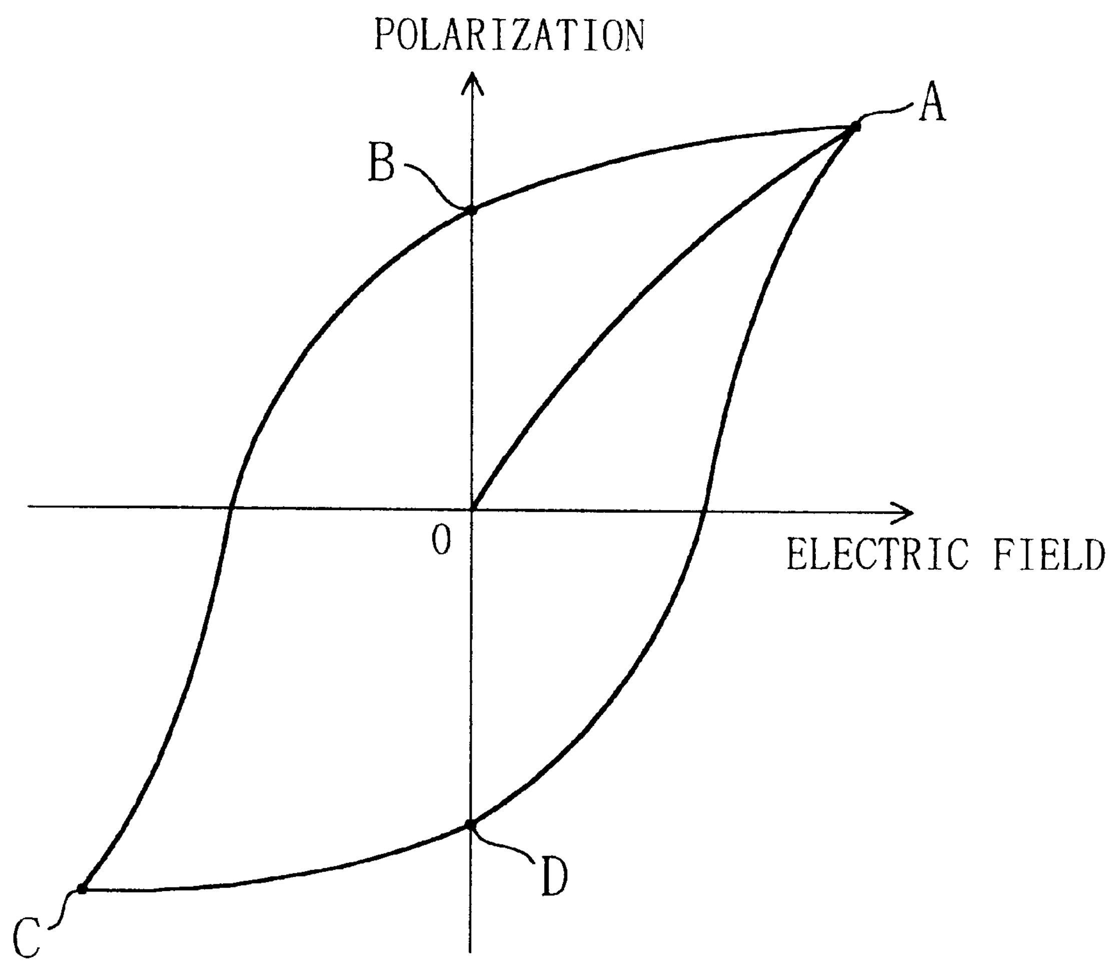
FIG. 19 is a chart showing a hysteresis curve or loop of a characteristic of a conventional ferroelectric memory device.

Next, when the logic voltage L is provided on the cell plate line CP with the logic signal H supplied to the word line WL at a time t13, H data is written in the other of the memory cell capacitors 13, 14 each having a ferroelectric film (e.g., the state indicated at point A in FIG. 19). As a result, the L data has a residual polarization indicated at point D in FIG. 19.

At that time, data "1" is stored in the memory cell with the H data written in the memory cell capacitor 13 and with the L data written in the capacitor 14, for example, while data "0" is stored in the memory cell with the L data written in the memory cell capacitor 13 and with the H data written in the memory cell capacitor 14.

Next, when the logic signal L is supplied to the word line WL at a time t14, the memory cell transistors 11, 12 are turned OFF to produce the state in which charge corresponding to the power-source voltage VDD remains at the one of the data accumulation nodes SN, /SN to which the logic voltage H has been applied. As a result, the write operation continues in the memory cell capacitor connected to the node of concern, i.e., the memory cell capacitor in which H data is written till the residual charge dissipates through leakage or like process. At this time, the H data reaches a state with the residual polarization indicated at point B in FIG. 19.

Next, when the logic signal L is supplied to the sense-amp control signal line SAE at a time t15, the operation of the sense amp circuit 3 is stopped so that the voltage between the bit lines BL, /BL becomes approximately zero. On the other hand, when the logic signal H is supplied to the bit-line voltage control signal line BP2, the voltage between the bit lines BL, /BL becomes the ground voltage VSS. However, since the memory cell transistors 11, 12 have already been turned OFF, the voltage between the data accumulation nodes SN, /SN does not change if the lowering of the voltage due to leakage is ignored.

The ferroelectric memory device according to the present invention is characterized by a write method in which the L voltage is provided on the word line WL at the time t14 with the logic signal H supplied to the sense-amp control signal line SAE and with the logic signal L supplied to the bit-line voltage control signal line BP2. In this state, the memory cell transistors 11, 12 are turned OFF but the charge corresponding to the logic voltage H remains continuously at the one of the data accumulation nodes SN, /SN to which the logic voltage H has been applied, as shown in FIG. 1. Since the charge corresponding to the logic voltage H remains on one of the both electrodes of the memory cell capacitor in which H data is written and produces an electric field therebetween, it follows that the writing of H data is performed, as will easily be understood from FIG. 19. In other words, the writing of H data in the memory cell capacitor continues, though the control operation for the writing of H data is completed at the time t14.

Thus, in the write operation according to the present embodiment, the period during the times t12 to t13 is the period for the writing of L data in the memory cell capacitor and the period during the times t13 to t14 is the period for the writing of H data in the memory cell capacitor with the application of the voltage. The period after the time t14 is the period for the writing of H data in the memory cell capacitor by using residual charge.

In accordance with the method of the present embodiment, the polarization-inverting write operation is performed continuously till the charge in the ferroelectric capacitor dissipates through junction leakage or through leakage between the both electrodes of the ferroelectric capacitor. The period required by the charge to dissipate is on the order of 100 msec even at a high temperature, which is sufficiently long to provide the residual polarization of satisfactorily large magnitude indicated at point B (point D if the definitions for H and L are switched) in FIG. 19. On the other hand, the write time during which writing is performed by control operation is substantially the same as the conventional write time shown in FIG. 18. Thus, since the ferroelectric memory device can retain a sufficiently large amount of charge even under low-voltage and low-temperature conditions, there can be implemented a high-speed write operation in which the period for the writing of H data by control operation is as short as several nanoseconds.

Figure 18:
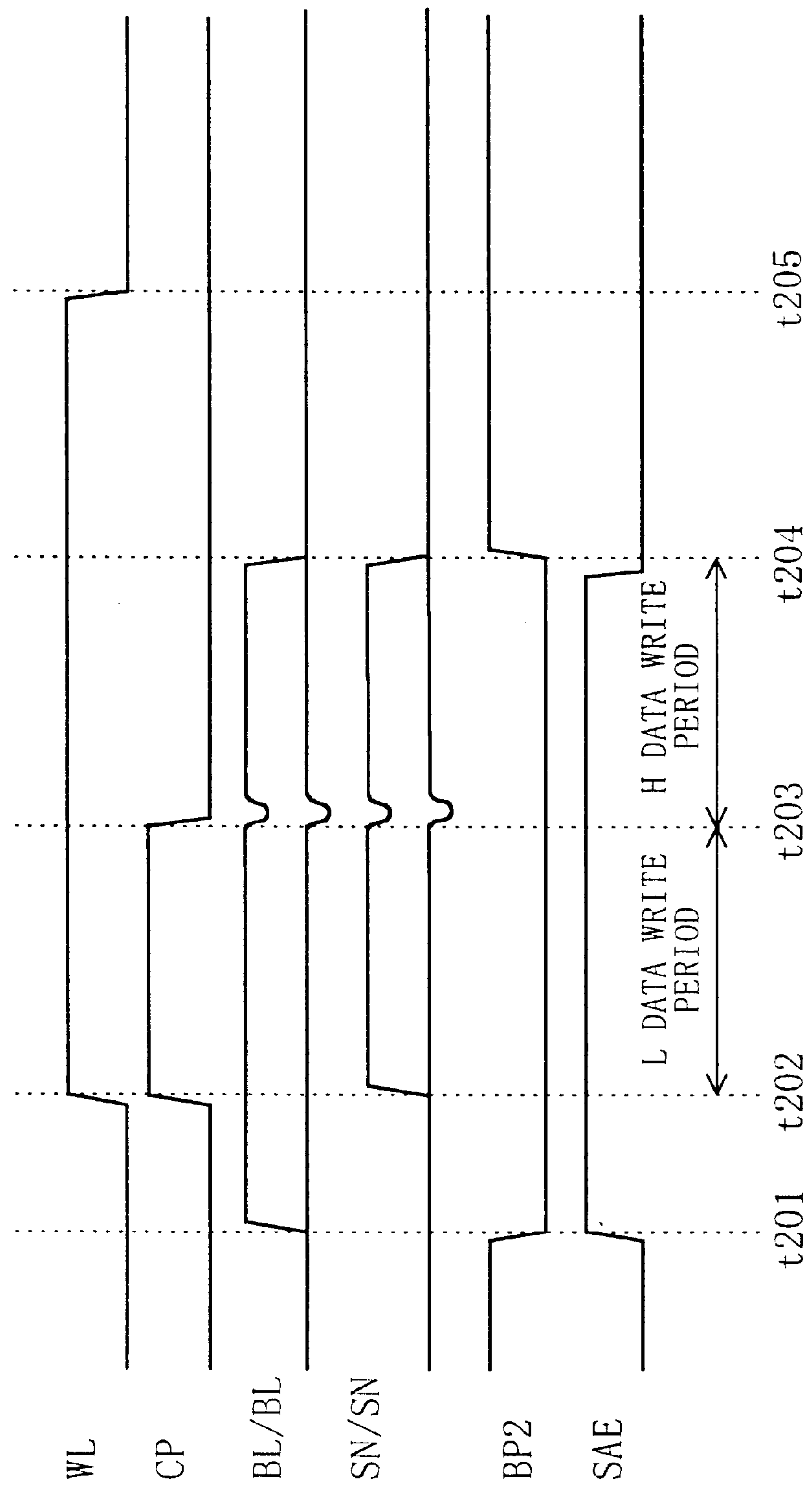
FIG. 18 is an operation timing chart for the conventional ferroelectric memory device.

Although the control periods according to the following embodiments may seem longer than the control period according to the present embodiment if a comparison is made between the waveforms in the operation timing chart of FIG. 18 according to the present embodiment and the waveforms in the other operation timing charts according to the following embodiments, the waveforms in the drawings do not represent the lengths of actual control periods since time scales used in the individual drawings are different from each other.

Embodiment 2

A second embodiment of the present invention will be described. Although the residual polarization of sufficiently large magnitude has been provided in the first embodiment with the charge at the power-source voltage remaining between the both electrodes of the ferroelectric capacitor, the degradation of the ferroelectric capacitor may be accelerated with the power-source voltage applied between the both electrodes of the ferroelectric capacitor for a long period of time if the power-source voltage is high. With respect to a device used with a high voltage for a long period of time, in particular, the disadvantage is not negligible.

To overcome the disadvantage, the present embodiment causes not charge at the power-source voltage, but charge at a sufficiently low voltage at which substantially no degradation of the ferroelectric capacitor occurs, to remain between the both electrodes of the ferroelectric capacitor.

Figure 2:
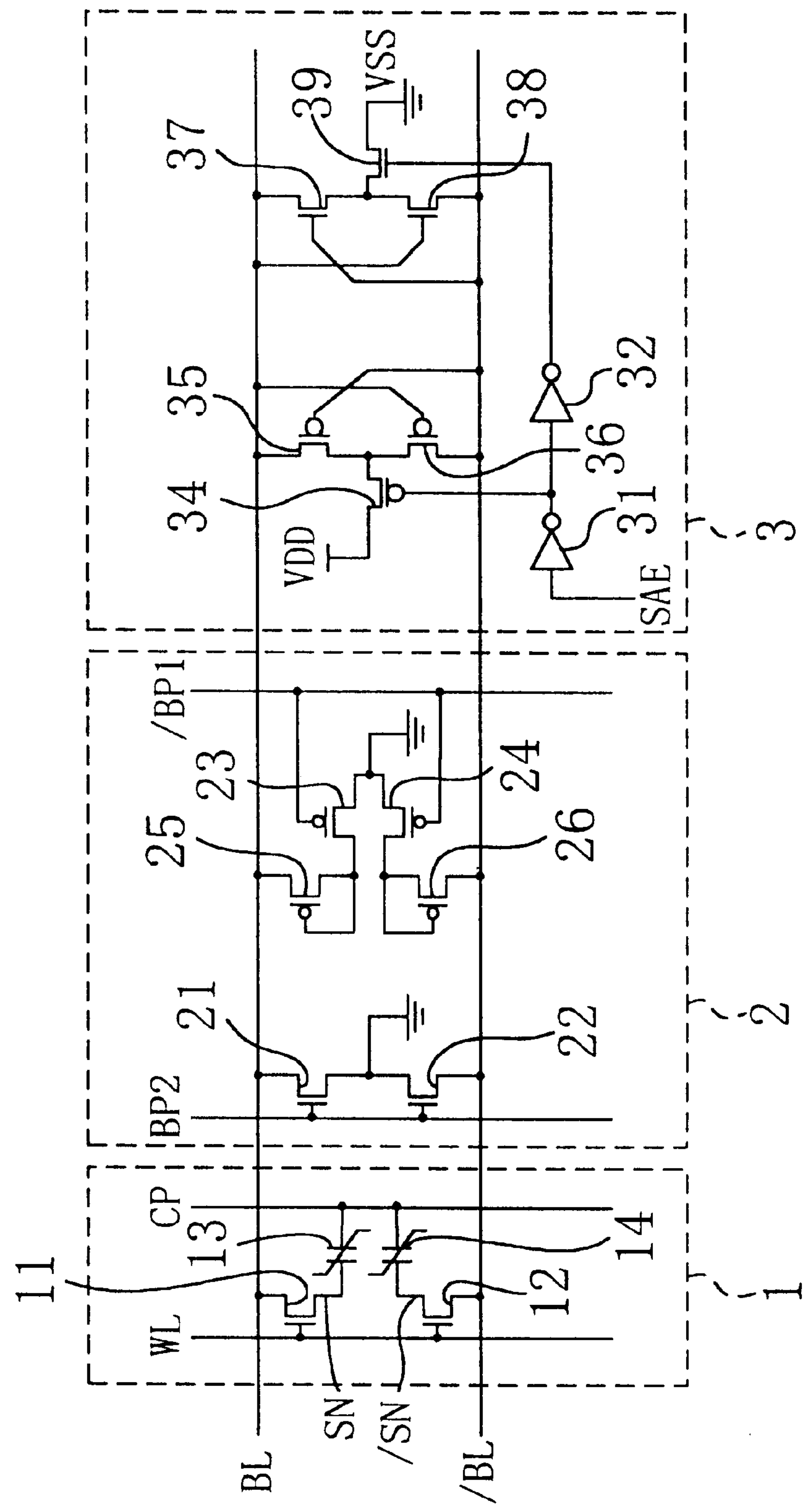
FIG. 2 is an electric circuit diagram showing the structure of a principal portion of a ferroelectric memory device according to a second embodiment of the present invention.

FIG. 2 is an electric circuit diagram showing the structure of a ferroelectric memory device according to the present embodiment, which is characterized in that two bit-line voltage control signal lines /BP1, BP2 are disposed in the bit-line voltage control circuit 2. As for the other components, they are the same as those of the conventional ferroelectric memory device shown in FIG. 17.

The bit-line voltage control signal line BP2 is connected to the respective gates of the two NMOS transistors 21, 22, similarly to the conventional structure, while the bit-line voltage control signal line /BP1 is connected to the respective gates of two PMOS transistors 23, 24. The PMOS transistors 23, 24 have respective drains connected to the bit lines BL, /BL via PMOS transistors 25, 26 each for a voltage drop and the common source connected to the ground. In short, the bit-line voltage control signal line BP2 is a signal line for precharging the bit lines BL, /BL to the ground voltage VSS, similarly to the conventional structure. By contrast, the bit-line voltage control signal line /BP1 is a signal line for precharging the bit lines BL, /BL to a voltage double the threshold voltage of each of the P-channel MOS transistors 25, 26.

Figure 3:
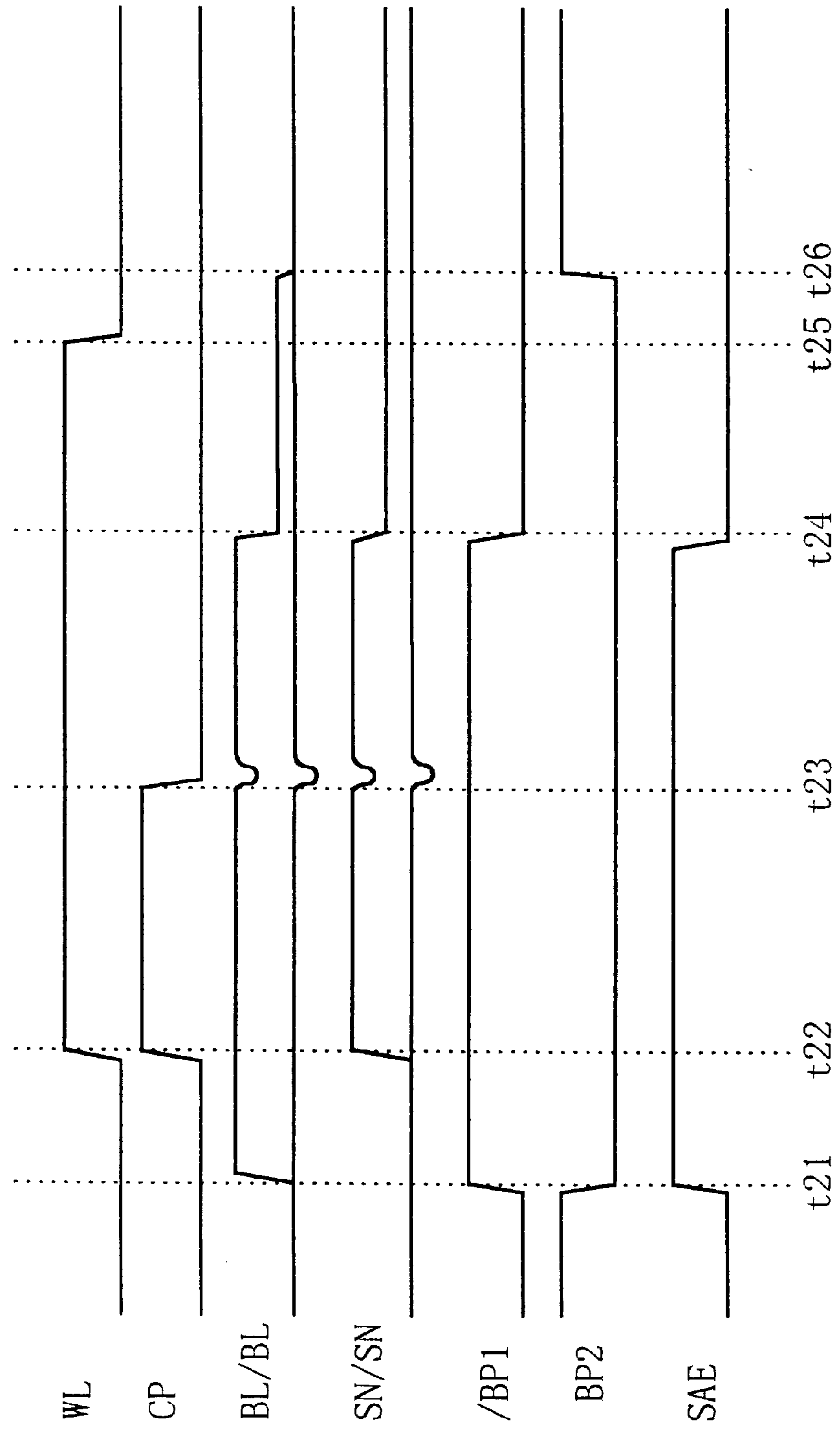
FIG. 3 is an operation timing chart for the ferroelectric memory device according to the second embodiment.

A description will be given to a write operation performed in the ferroelectric memory device according to the present embodiment. FIG. 3 is an operation timing chart illustrating the write operation performed in the ferroelectric memory device according to the present embodiment.

First, when the logic voltage L is applied to the bit-line voltage control signal line BP2 and the logic voltage H is applied to the bit-line voltage control signal line /BP1 at a time t21, the NMOS transistors 21, 22 are turned OFF in the bit-line voltage control circuit 2 to stop the precharging of the bit lines BL, /BL to the ground voltage VSS. At this time, since the voltage on the bit-line voltage control signal line /BP1 is the logic voltage H, the PMOS transistors 23, 24 are in the OFF state and exert no influence on respective potentials on the bit lines BL, /BL. On the other hand, data to be written from the outside is transferred to the bit lines BL, /BL and the logic signal H is supplied to the sense-amp control signal line SAE to operate the sense amp circuit 3, so that the data on the bit lines BL, /BL is latched thereby.

Next, when the logic signal H is supplied to the word line WL at a time t22, the memory cell transistors 11, 12 are turned ON and respective voltages at the data accumulation nodes SN, /SN become equal to respective voltages on the bit lines BL, /BL. When the logic signal H is supplied simultaneously to the cell plate line CP, L data is written in one of the memory cell capacitors 13, 14 each having the ferroelectric film.

Next, when the logic voltage L is provided on the cell plate line CP with the logic signal H supplied to the word line WL at a time t23, H data is written in the other of the memory cell capacitors 13, 14 each having the ferroelectric film.

Next, when the logic signal L is supplied to the sense-amp control signal line SAE at a time t24 to stop the operation of the sense amp circuit 3 and then the logic signal L is supplied to the bit-line voltage control signal line /BP1, the PMOS transistors 23, 24 in the bit-line voltage control circuit 2 are turned ON so that the voltage double the threshold voltage of the P-channel MOS transistor, instead of the power-source voltage VDD, is applied to the bit lines BL, /BL.

Next, when the logic signal L is supplied to the word line WL at a time t25, the memory transistors 11, 12 are turned OFF to produce the state in which charge corresponding to the logic voltage H remains at the one of the data accumulation nodes SN, /SN to which the logic voltage H has been applied. As a result, the write operation continues in the memory cell capacitor connected to the node of concern in which H data is written till the residual charge dissipates through leakage or like process.

Next, when the logic signal H is supplied to the bit-line voltage control signal line BP2 at a time t26, the voltages on the bit lines BL, /BL become the ground voltage VSS, whereby the write operation is completed.

In the write operation, the period between the times t22 and t23 is the period for the writing of L data in the memory cell capacitor and the period between the times t23 and t25 is the period for the writing of H data in the memory cell capacitor with the application of a control voltage. The period after the time t25 is the period for the writing of H data in the memory cell capacitor by using residual charge. In that case, the present embodiment applies a voltage lower than the power-source voltage (approximately double the threshold voltage of the transistor) between the both electrodes of the memory cell capacitor in which H data is written during the second half of the period for the writing of H data with the application of the control voltage. During the period for the writing of H data by using residual charge, on the other hand, the charge corresponding to the voltage double the threshold voltage of the MOS transistors remains at the data accumulation node connected to the memory cell capacitor in which H data is written.

The structure of the ferroelectric memory device and the write method according to the present embodiment are the same as those used in the first embodiment in that the period for the writing of H data by using residual charge is provided after the completion of the writing of H data performed by control operation. Consequently, the ferroelectric memory device according to the present embodiment can achieve the same effects as the ferroelectric memory device according to the first embodiment.

Moreover, the present embodiment causes the charge corresponding to the sufficiently low voltage at which substantially no deterioration of the ferroelectric capacitor occurs, not the charge corresponding to the power-source voltage, to remain between the both electrodes of the ferroelectric capacitor during the second half of the period for the writing of H data by control operation and during the period for the writing of H data by using residual charge. Specifically, the present embodiment performs the write operation in accordance with a method in which the power-source voltage is applied between the both electrodes of the ferroelectric capacitor during the writing of H data performed by control operation and then the voltage applied therebetween is lowered to a value approximately double the threshold voltage of the P-channel MOS transistor during the writing of H data performed by control operation. The voltage is on the order of, e.g., 2 V or less and the ferroelectric capacitor does not substantially deteriorate even when the voltage on such an order is applied over an extended period of time.

Thus, the ferroelectric memory device according to the present embodiment is advantageous in that, even when the power-source voltage is higher than or lower than in the first embodiment, it can be adjusted to a value on the same order.

Embodiment 3

A third embodiment of the present invention will be described. Although the H data write period for causing the polarization required for data retention to remain in the ferroelectric capacitor under low-voltage and low-temperature conditions has been reduced significantly in the ferroelectric memory devices according to the first and second embodiments, the L data write period is substantially the same as in the conventional ferroelectric memory device. In view of the foregoing, the present embodiment will describe an approach to reducing the L data write period for causing the polarization required for data retention to remain in the ferroelectric capacitor.

Figure 4:
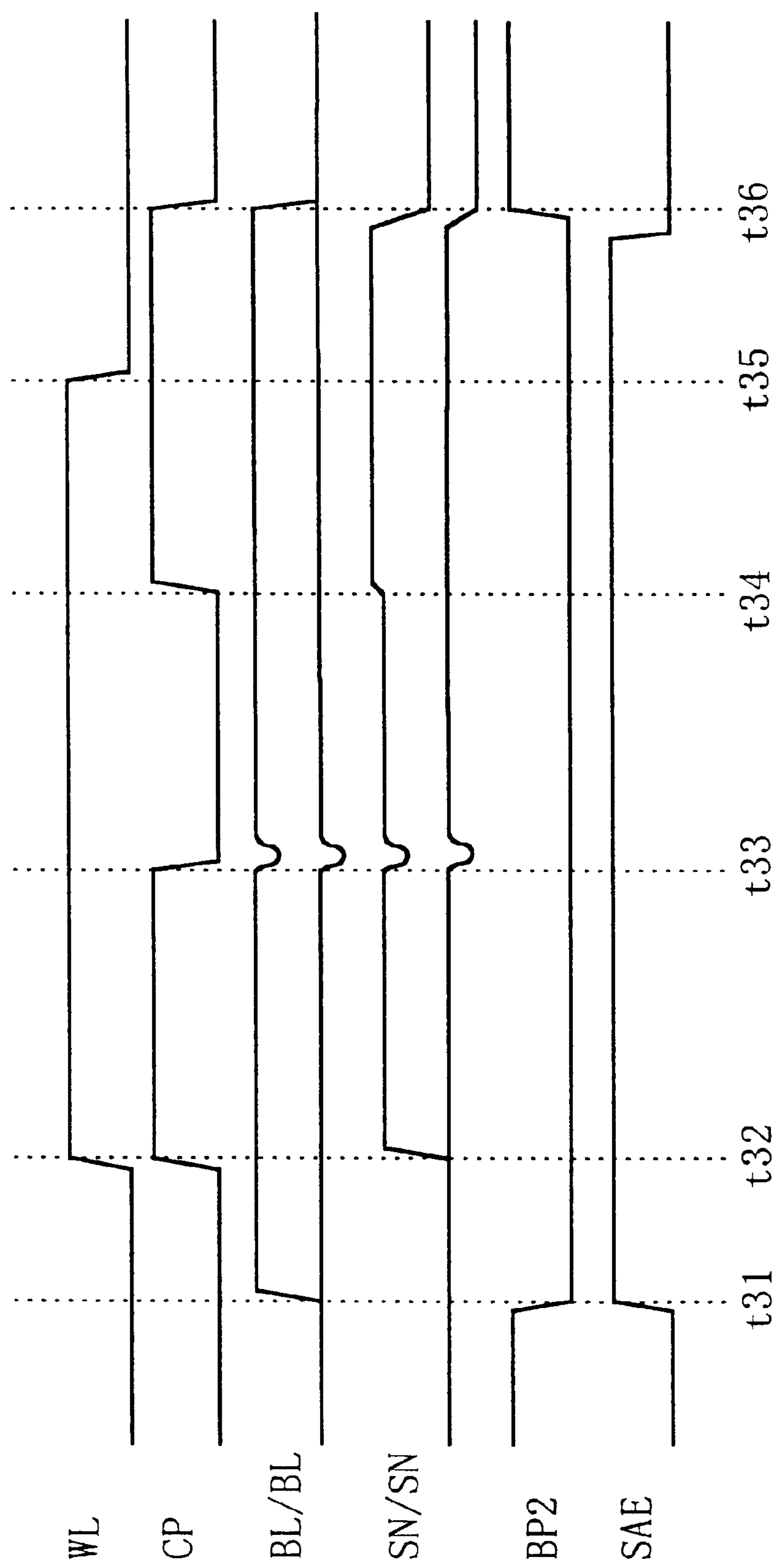
FIG. 4 is an operation timing chart for a ferroelectric memory device according to a third embodiment of the present invention.
Figure 17:
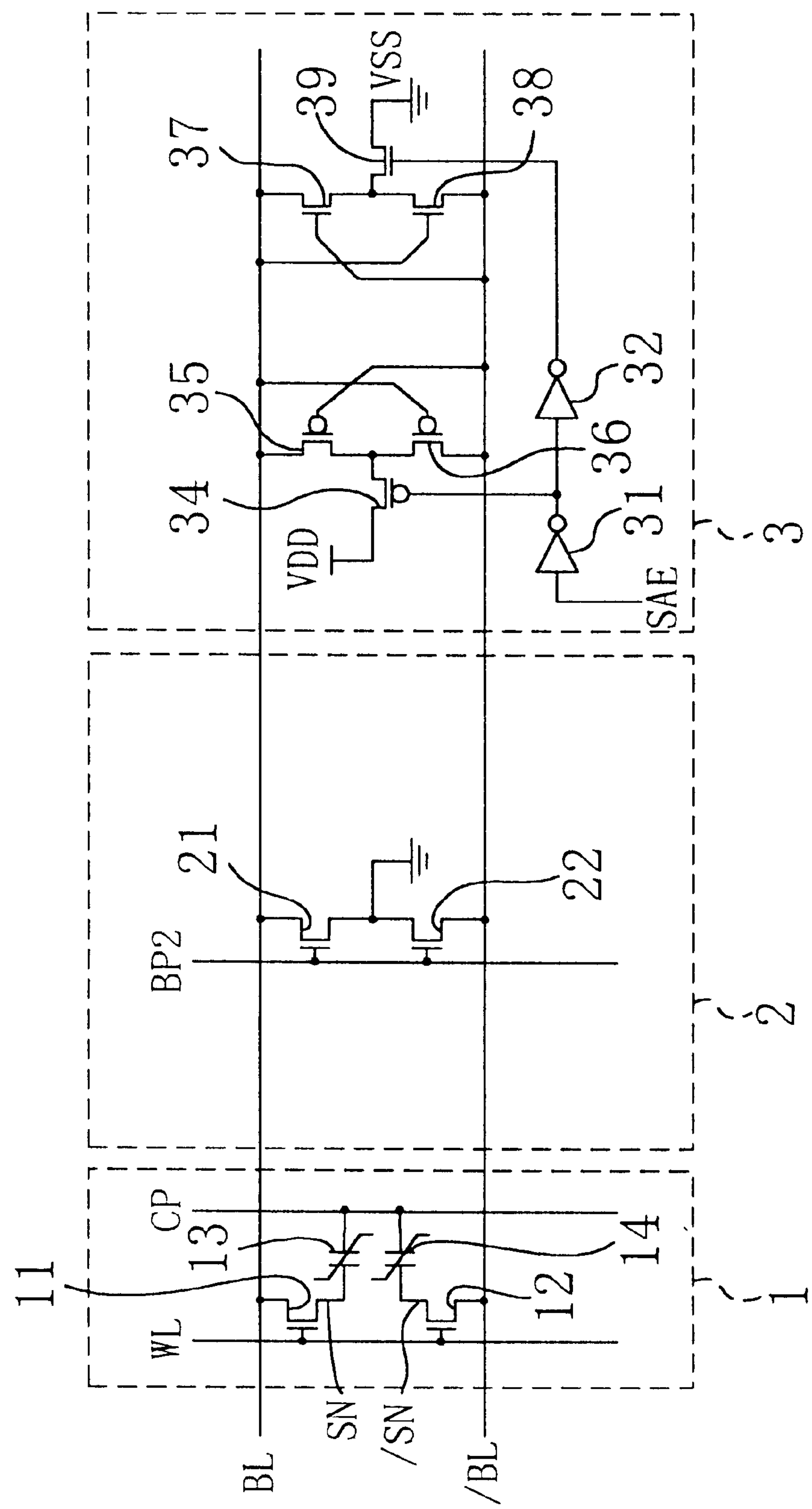
FIG. 17 is an electric circuit diagram showing a principal portion of a conventional ferroelectric memory device.

The ferroelectric memory device according to the present embodiment is the same in structure as the conventional ferroelectric memory device shown in FIG. 17 and different only in operation timing therefrom. FIG. 4 is an operation timing chart illustrating a write operation performed in the ferroelectric memory device according to the present embodiment.

First, when the logic signal L is supplied to the bit-line voltage control signal line BP2 at a time t31, the NMOS transistors 21, 22 are turned OFF in the bit-line voltage control circuit 2 to stop the precharging of the bit lines BL, /BL to the ground voltage VSS. On the other hand, data to be written from the outside is transferred to the bit lines BL, /BL and the logic signal H is supplied to the sense-amp control signal line SAE to operate the sense amp circuit 3, so that the data on the bit lines BL, /BL is latched thereby.

Next, when the logic signal H is supplied to the word line WL at a time t32, the memory cell transistors 11, 12 are turned ON and the respective voltages at the data accumulation nodes SN, /SN become equal to the respective voltages on the bit lines BL, /BL. When the logic signal H is supplied simultaneously to the cell plate line CP, L data is written in one of the memory cell capacitors 13, 14 each having the ferroelectric film.

Next, when the logic voltage L is provided on the cell plate line CP at a time t33 with the logic signal H supplied to the word line WL, H data is written in the other of the memory cell capacitors 13, 14 each having the ferroelectric film.

Next, the logic signal H is supplied again to the cell plate line CP at a time t34 so that control operation for writing the L data in the capacitors 13, 14 each formed of the ferroelectric film is performed. At this time, when the voltage on the word line WL is the power-source voltage VDD, a voltage increase corresponding to the threshold voltage of the memory cell transistor occurs at the one of the data accumulation nodes SN, /SN to which the logic voltage H has been applied with a voltage increase at the electrode of the memory cell capacitor connected to the cell plate line CP.

Next, when the logic signal L is supplied to the word line WL at a time t35, the memory cell transistors 11, 12 are turned OFF to produce the state in which charge corresponding to a voltage obtained by adding the threshold voltage of the memory cell transistor to the power-source voltage VSS is continuously retained at the one of the data accumulation nodes SN, /SN to which H data is written, while charge corresponding to the ground voltage VSS is continuously applied to the other of the data accumulation nodes SN, /SN to which L data is written. Charge corresponding to the power-source voltage VDD and having a polarity opposite to that of the charge remaining between the both electrodes of the one of the memory cell capacitors 13, 14 in which H data is written remains between the both electrodes of the other of the capacitors 13, 14 in which L data is written. On the other hand, the charge corresponding to the voltage obtained by adding the threshold voltage of the memory cell transistor to the power-source voltage VDD remains between the both electrodes of the one of the memory cell transistors 13, 14 in which H data is written.

Next, the logic signal L is supplied to the sense-amp control signal line SAE at a time t36 to stop the operation of the sense amp circuit 3 and then the logic signal L is supplied to the cell plate line CP, while the logic signal H is supplied to the bit-line voltage control signal line BP2, to provide the ground voltage VSS on each of the bit lines BL, /BL, whereby the write operation under control is completed. In this state, charge corresponding to the threshold voltage of the memory cell transistor remains at the one of the data accumulation nodes SN, /SN to which H data is written, while charge corresponding to a negative voltage obtained by subtracting the built-in voltage from the ground potential VSS remains at the other of the data accumulation nodes SN, /SN to which L data is written. As a result, the writing of L data is performed continuously till the residual charge at the one of the data accumulation nodes SN, /SN to which L data is written dissipates through leakage or like process.

In the write operation according to the present embodiment, therefore, the period between the times t32 to t33 is the period for the initial writing of the L data in the memory cell capacitor and the period during the times t33 to t34 is the period for the writing of H data in the memory cell capacitor. The period between the times t34 to t35 is the period for the rewriting of L data by control operation and the period after the time t35 is the period for the writing of H data in the memory cell capacitor by using residual charge. It is to be noted that, after the time t36, the writing of L data is performed with a negative voltage as low as the difference between the ground potential VSS and the built-in voltage.

In the method according to the present embodiment, the logic signal H is supplied to the cell plate line CP and the logic signal L is supplied to the bit line BL so that the memory cell transistor is turned OFF with the remaining charge retained at the data accumulation/retention node connected to the memory cell capacitor in which L data is written and then the logic signal L is supplied to the cell plate line CP. The method permits the writing of L data using the remaining charge. Thus, since the ferroelectric memory device can retain a sufficiently large amount of charge even under low-voltage and low-temperature conditions, the L data can be written by a high-speed operation.

It is to be noted that the voltage corresponding to the charge remaining at the data accumulation node to which L data is written after the supply of the logic signal L to the cell plate line CP at the time t36 has a minimum value obtained by subtracting the built-in voltage from the ground voltage VSS. Since the built-in voltage is about 0.7 V, the use of the residual charge achieves the effect of providing a voltage at which no deterioration of the ferroelectric capacitor occurs.

Since the power-source voltage VDD and the voltage obtained by adding the threshold voltage of the memory cell transistor to the power-source voltage VDD are applied between the both electrodes of the memory cell capacitor in which H data is written while the logic voltage H equal to the power-source VDD is applied to the cell plate line CP, the writing of H data based on the voltage difference therebetween can be performed during the period between the times t34 and t36.

Embodiment 4

A fourth embodiment of the present invention will be described. Although the third embodiment has permitted the writing of L data by using residual charge in addition to the writing of L data by control operation, it is difficult to use the method in combination with the method of writing the H data by using the sufficiently large residual charge according to the second embodiment.

In view of the foregoing, the present embodiment will describe another approach to reducing the L data write period, which can also be used easily in combination with the method according to the second embodiment.

Figure 5:
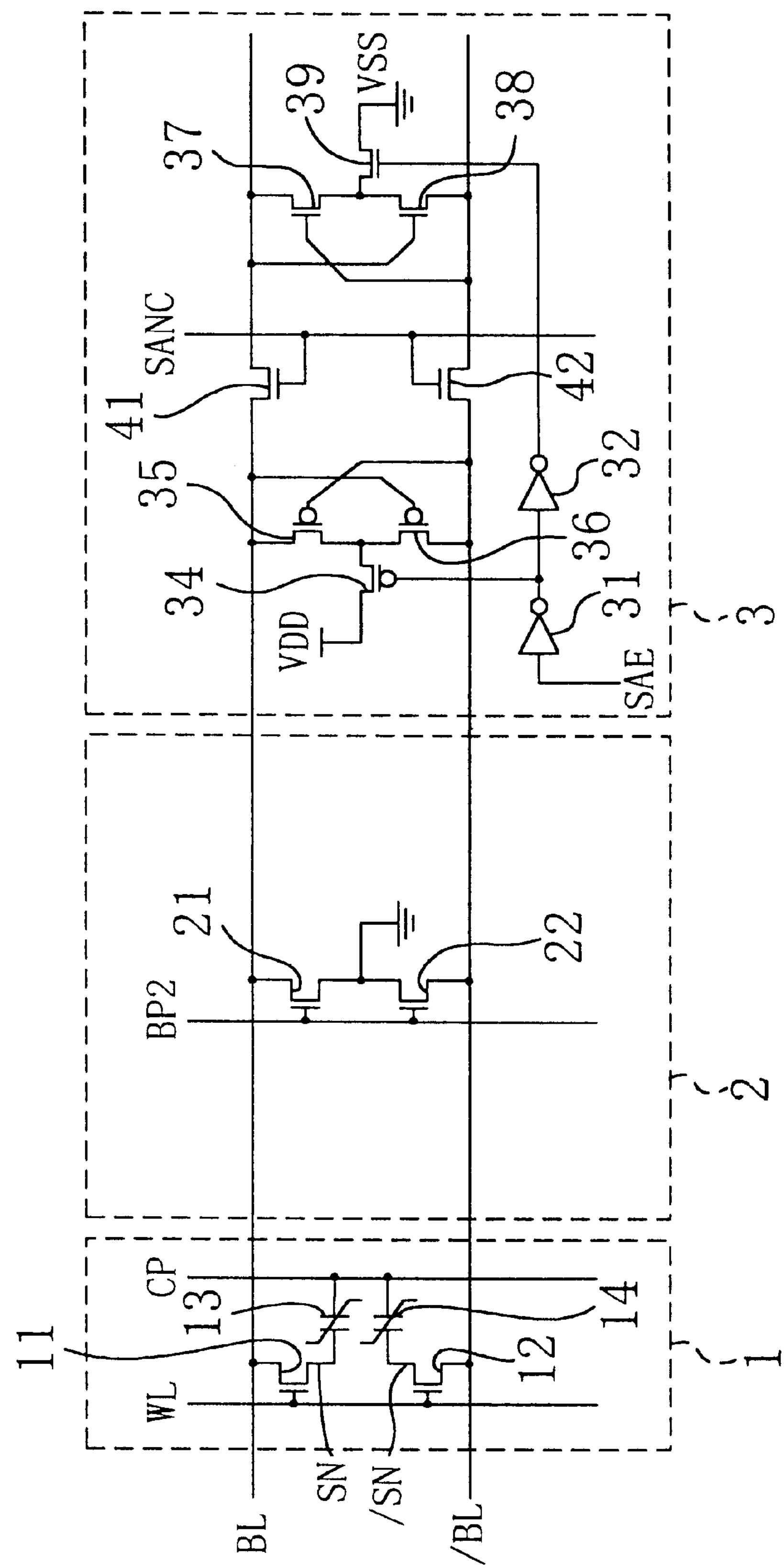
FIG. 5 is an electric circuit diagram showing the structure of a principal portion of a ferroelectric memory device according to a fourth embodiment of the present invention.

FIG. 5 is an electric circuit diagram showing the structure of a ferroelectric memory device according to the present embodiment, which further comprises an additional sense-amp control signal line SANC and respective NMOS transistors 41, 42 provided to intervene the bit lines BL, /BL in the sense amp circuit 3 in addition to the structure of the ferroelectric memory device shown in FIG. 17, so that the additional sense-amp control signal line SANC is connected to the gate of each of the NMOS transistors 41, 42. The ferroelectric memory device according to the present embodiment features the function of placing only the one of the bit lines BL, /BL to which the logic voltage L is applied in a floating state. As for the other components, they are the same as those of the conventional ferroelectric memory device shown in FIG. 17.

Figure 6:
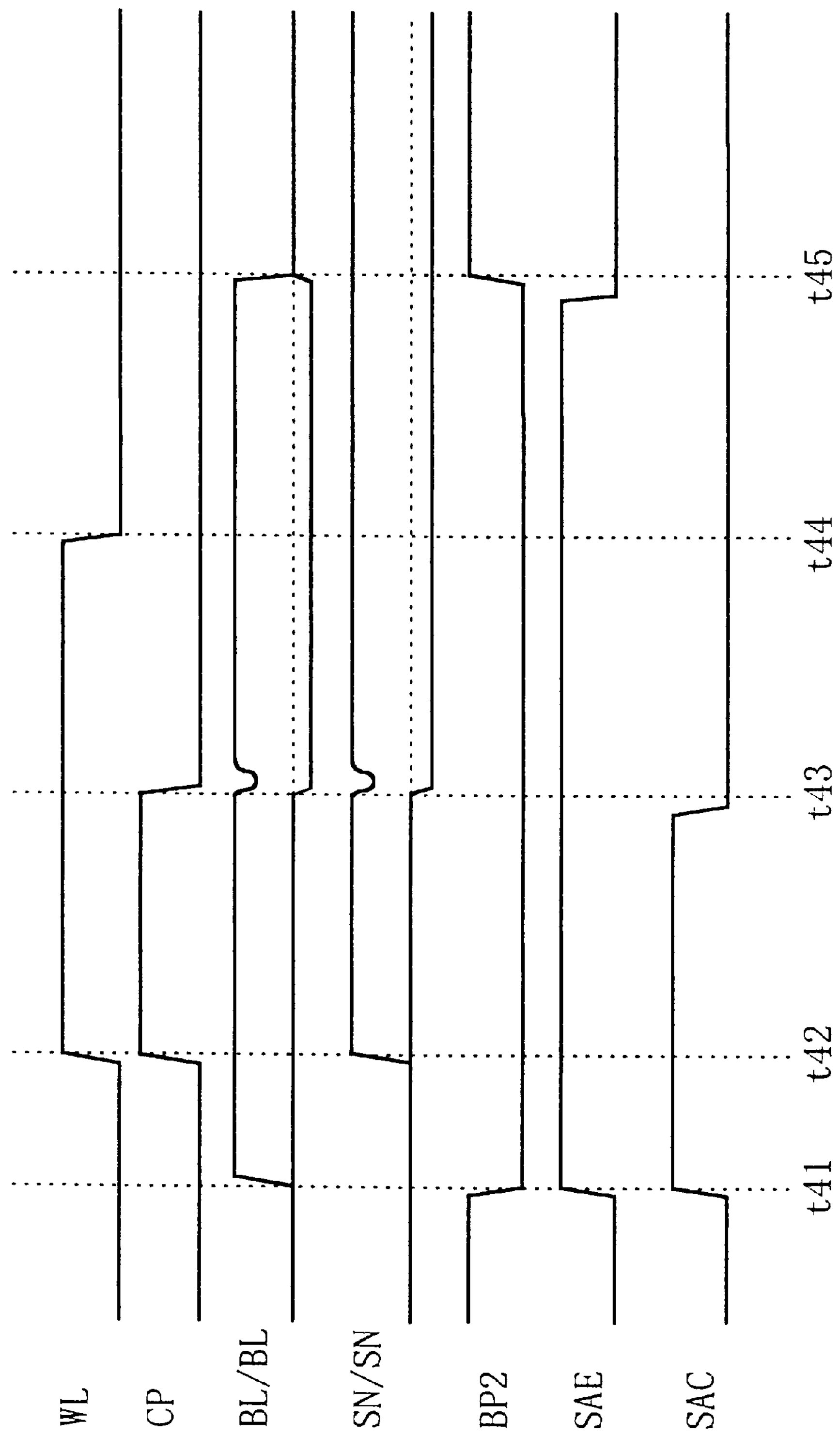
FIG. 6 is an operation timing chart for the ferroelectric memory device according to the fourth embodiment.

A description will be given to a write operation performed in the ferroelectric memory device according to the present embodiment. FIG. 6 is an operation timing chart illustrating the write operation performed in the ferroelectric memory device according to the present embodiment.

First, when the logic signal L is supplied to the bit-line voltage control signal line BP2 at a time t41, the NMOS transistors 21, 22 are turned OFF in the bit-line voltage control circuit 2 to stop the precharging of the bit lines BL, /BL to the ground voltage VSS. On the other hand, data to be written from the outside is transferred to the bit lines BL, /BL and the logic signal H is supplied to the sense-amp control signal line SAE and to the additional sense amp signal line SAC to operate the sense amp circuit 3, so that the data on the bit lines BL, /BL is latched thereby.

Next, when the logic signal H is supplied to the word line WL at a time t42, the memory cell transistors 11, 12 are turned ON and the respective voltages on the data accumulation nodes SN, /SN become equal to the respective voltages on the bit lines BL, /BL. When the logic signal H is supplied simultaneously to the cell plate line CP, L data is written in one of the memory cell capacitors 13, 14 each having the ferroelectric film.

Next, when the logic signal L is supplied to the cell plate line CP at a time t43 with the logic signal H supplied to the word line WL, H data is written in the other of the memory cell capacitors 13, 14 each having the ferroelectric film. At that time, the logic signal L is supplied to the additional sense-amp control signal line SAC to turn OFF the NMOS transistors 41, 42 so that only one of the bit lines BL, /BL with the logic voltage L is brought into the floating state. In the mean time, the writing of L data is performed continuously in the memory cell capacitor in which L data is to be written, while a voltage obtained by subtracting the built-in voltage from the ground voltage VSS is applied to the data accumulation node.

Next, when the logic signal L is supplied to the word line WL at a time t44, the memory cell transistors 11, 12 are turned OFF. At this time, the charge corresponding to the logic voltage H remains at the one of the data accumulation nodes SN, /SN to which the logic voltage H has been applied, while the negative voltage obtained by subtracting the built-in voltage from the ground potential VSS remains at the other of the data accumulation nodes SN, /SN to which the logic voltage L has been applied. As a result, the writing of H and L data is performed continuously till the residual charge at the data accumulation nodes SN, /SN dissipates through leakage or like process.

Next, the logic signal L is supplied to the sense-amp control signal line SAE at a time t45 to stop the operation of the sense amp circuit 3 and then the logic signal H is supplied to the bit-line voltage control signal line BP2 to provide the ground voltage VSS on each of the bit lines BL, /BL, whereby the write operation under control is completed. At this time, the residual charge since the time t44 has remained at each of the data accumulation nodes SN, /SN.

Here, the period between the times t42 to t43 is the period for the writing of L data in the memory cell capacitor by control operation and the period between the times t43 to t44 is the period for the writing of H and L data in the memory cell capacitor with the application of the control voltage. The period after the time t44 is the period for the writing of H and L data in the memory cell capacitor by using residual charge.

According to the present embodiment, since the one of the bit lines BL, /BL to which the logic voltage L has been applied is brought into the floating state when the voltage on the cell plate line CP is switched from the logic voltage H to the logic voltage L, a voltage lower than the ground voltage VSS by the value of the built-in voltage can be provided at the one of the data accumulation nodes SN, /SN connected to the memory cell capacitor in which the writing of L data is performed. Consequently, the writing of L data can be performed with a less intense electric field even during the writing of H data by control operation. Moreover, the writing of L data by using residual charge can be performed even after the writing of H data by control operation is completed. In addition, the same effects as achieved by the first embodiment can be achieved in writing the H data by using residual charge.

It will be appreciated that the method according to the second embodiment may also be used in combination to perform the writing H data by using residual charge. As for the writing of L data, it can be performed by using the method according to the third embodiment in combination.

Embodiment 5

Next, a fifth embodiment of the present invention will be described. The present embodiment is a combination of the third and fourth embodiments.

Figure 7:
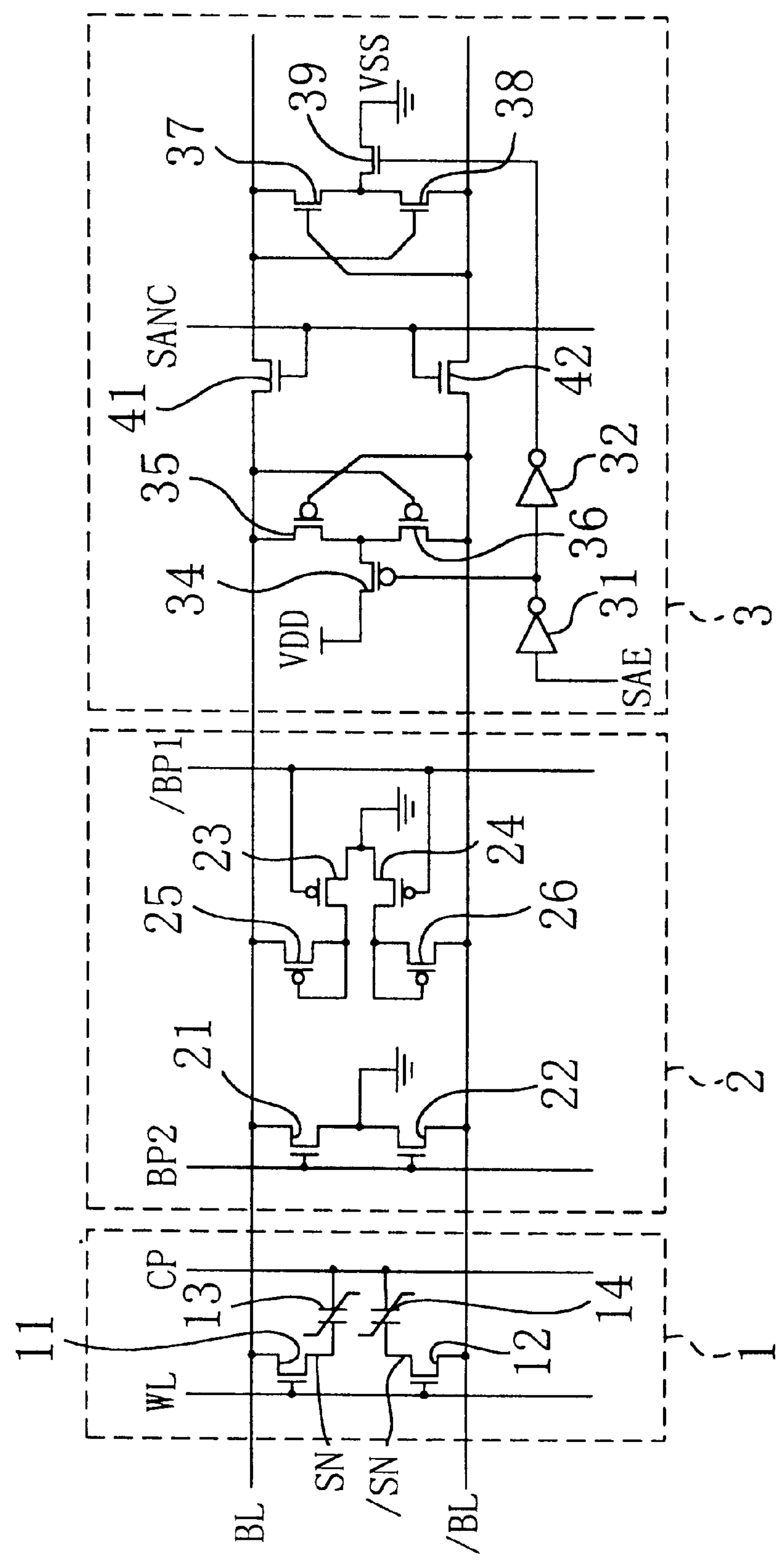
FIG. 7 is an electric circuit diagram showing the structure of a principal portion of a ferroelectric memory device according to a fifth embodiment of the present invention.

FIG. 7 is an electric circuit diagram showing the structure of a ferroelectric memory device according to the present embodiment. The ferroelectric memory device according to the present embodiment is characterized in that it has the features of the ferroelectric memory devices according to the second and fourth embodiments in addition to the structure of the ferroelectric memory device shown in FIG. 17. Specifically, the two bit-line voltage control signal lines /BP1, BP2, which are the same as shown in FIG. 2, are provided in the bit-line voltage control circuit 2. In addition to that, the additional sense-amp control signal line SANC and the NMOS transistors 41, 42 provided to intervene the respective bit lines BL, /BL, each of which is the same as shown in FIG. 5, are further provided in the sense amp circuit 3. As for the other components, they are the same as those of the conventional ferroelectric memory device shown in FIG. 17.

Figure 8:
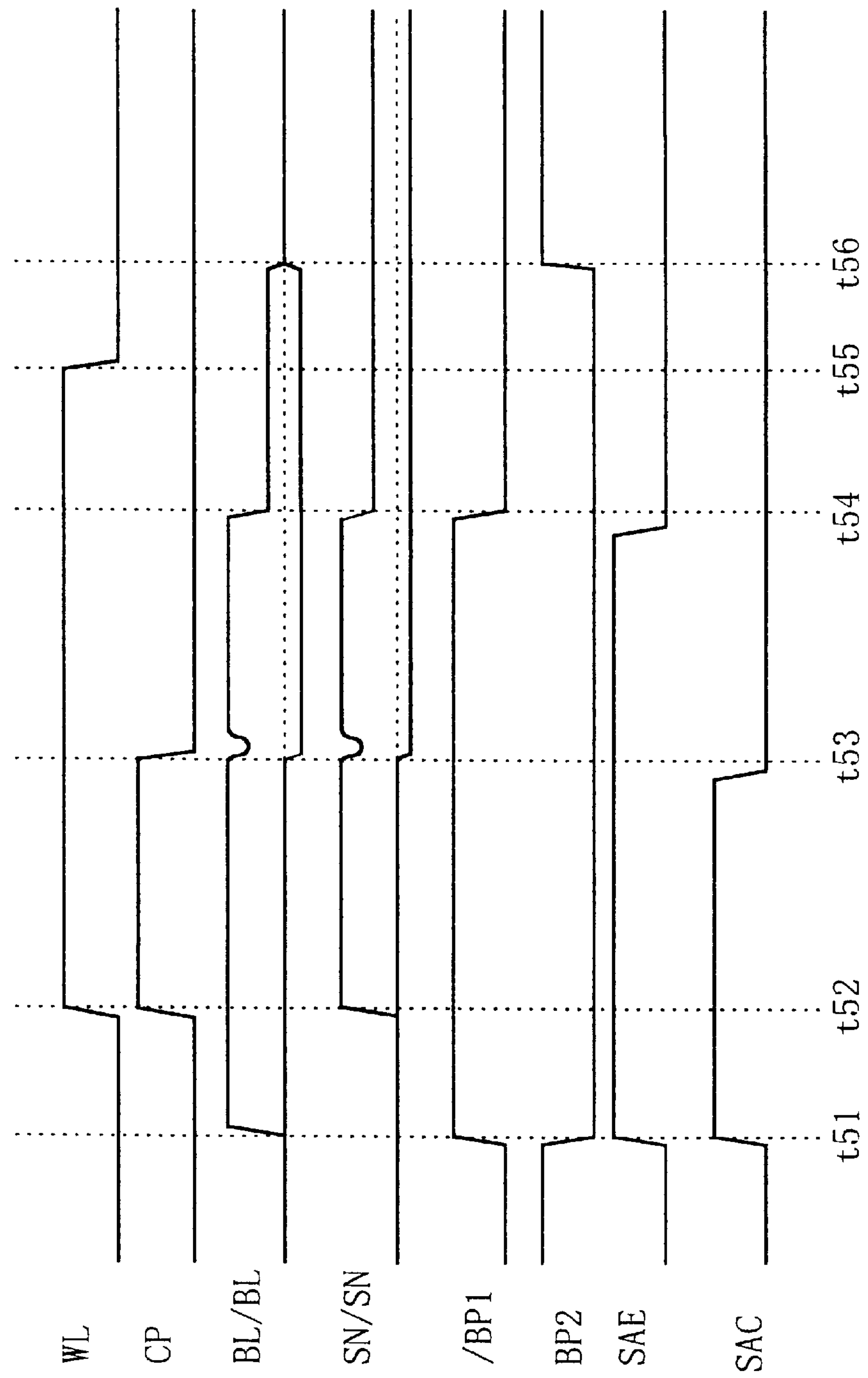
FIG. 8 is an operation timing chart for the ferroelectric memory device according to the fifth embodiment.

A description will be given to a write operation performed in the ferroelectric memory device according to the present embodiment. FIG. 8 is an operation timing chart illustrating the write operation performed in the ferroelectric memory device according to the present embodiment.

First, when the logic voltage L is applied to the bit-line voltage control signal line BP2 and the logic voltage H is applied to the bit-line voltage control signal line /BP1 at a time t51, the NMOS transistors 21, 22 are turned OFF in the bit-line voltage control circuit 2 to stop the precharging of the bit lines BL, /BL to the ground voltage VSS. At this time, since the voltage on the bit-line voltage control signal line /BP1 is the logic voltage H, the PMOS transistors 23, 24 are in the OFF state and exert no influence on the potentials on the bit lines BL, /BL. On the other hand, data to be written from the outside is transferred to the bit lines BL, /BL and the logic signal H is supplied to the sense-amp control signal line SAE and to the additional sense amp signal line SAC to operate the sense amp circuit 3, so that the data on the bit lines BL, /BL is latched thereby.

Next, when the logic signal H is supplied to the word line WL at a time t52, the memory cell transistors 11, 12 are turned ON and the respective voltages at the data accumulation nodes SN, /SN become equal to the respective voltage on the bit lines BL, /BL. When the logic signal H is supplied simultaneously to the cell plate line CP, L data is written in one of the memory cell capacitors 13, 14 each having the ferroelectric film.

Next, when the logic signal L is supplied to the cell plate line CP at a time t53 with the logic signal H supplied to the word line WL, H data is written in the other of the memory cell capacitors 13, 14 each having the ferroelectric film. At that time, the logic signal L is supplied to the additional sense-amp control signal line SAC to turn OFF the NMOS transistors 41, 42 so that only one of the bit lines BL, /BL with the logic voltage L is brought into the floating state. In the mean time, the writing of L data is performed continuously in the memory cell capacitor in which L data is to be written, while a voltage obtained by subtracting the built-in voltage from the ground voltage VSS is applied to the data accumulation node.

Next, the logic signal L is supplied to the sense-amp control signal line SAE at a time t54 to stop the operation of the sense amp circuit 3 and then the logic signal L is supplied to the bit-line voltage control signal line /BP1 to turn ON the PMOS transistors 23, 24 in the bit-line voltage control circuit 2, so that the voltage double the threshold voltage of the P-channel MOS transistors, instead of the power-source voltage VDD, is applied to the bit lines BL, /BL.

Next, when the logic signal L is supplied to the word line WL at a time t55, the memory cell transistors 11, 12 are turned OFF. At this time, the charge corresponding to the voltage double the threshold voltage of the P-channel MOS transistor remains at the one of the data accumulation nodes SN, /SN to which the logic voltage H has been applied, while the charge corresponding to the negative voltage obtained by subtracting the built-in voltage from the ground potential VSS remains at the other of the data accumulation nodes SN, /SN to which the logic voltage L has been applied. As a result, the writing of H and L data is performed continuously till the residual charge at the data accumulation nodes SN, /SN dissipates through leakage or like process.

Next, the logic signal H is supplied to the bit-line voltage control signal line BP2 at a time t56 to provide the ground voltage VSS on each of the bit lines BL, /BL, whereby the write operation under control is completed. At this time, the residual charge since the time t54 has remained at each of the data accumulation nodes SN, /SN if leakage is ignored.

Here, the period between the times t52 to t53 is the period for the writing of L data in the memory cell capacitor by control operation and the period between the times t53 to t55 is the period for the writing of H and L data in the memory cell capacitor with the application of the control voltage. The period after the time t55 is the period for the writing of H and L data in the memory cell capacitor by using residual charge.

The ferroelectric memory device according to the present embodiment can achieve the effects of the second embodiment in addition to the effects of the fourth embodiment. Specifically, either H data or L data can be written by a high-speed operation under low-voltage and low-temperature conditions and the degradation of reliability induced by the application of a high voltage to the memory cell capacitor over an extended period can be prevented.

Although the ferroelectric memory device having the 2T2C configuration has been described by way of example in each of the first to fifth embodiments, the present invention is also applicable to a ferroelectric memory device having the 1T1C or 2T1C configuration described above. In that case, although complementary data cannot be used because only one ferroelectric capacitor is provided in one memory cell, digital data can be stored by designating a polarization state indicated at point B in FIG. 19 as H data and designating a polarization state indicated at point D in FIG. 19 as L data. The H and L data can be written by using residual charge after the completion of writing under control in accordance with the same method as used in each of the foregoing embodiments.

Embodiment 6

Figure 9:
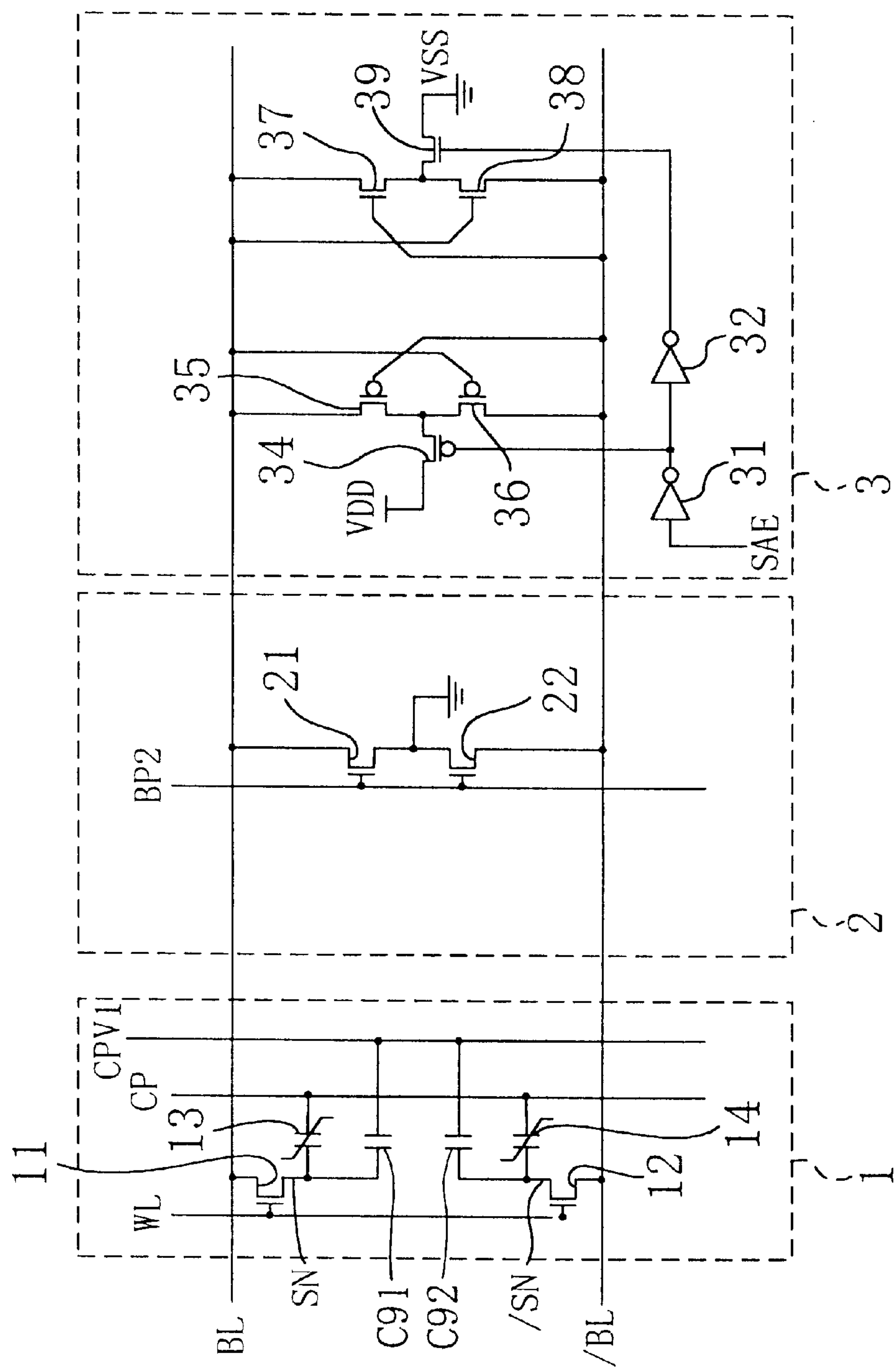
FIG. 9 is an electric circuit diagram showing the structure of a principal portion of a ferroelectric memory device according to a sixth embodiment of the present invention.

FIG. 9 is an electric circuit diagram showing the structure of a ferroelectric memory device according to a sixth embodiment. The ferroelectric memory device according to the present embodiment is characterized in that a capacitor plate line CPV1 with a fixed voltage is provided in the memory cell 1 and that charge supply capacitors 15, 16 disposed in parallel to the memory cell capacitors 13, 14 are interposed between the respective data accumulation nodes SN, /SN and the capacitor plate line CPV1. As for the other components, they are the same as those of the conventional ferroelectric memory device shown in FIG. 17, which has already been described.

The operation timing for the writing of data in the ferroelectric memory device according to the present embodiment is as shown in the operation timing chart for the first embodiment shown in FIG. 1.

Briefly, when the logic signal L is supplied to the word line WL at the time t14 in the operation timing chart shown in FIG. 1, the charge corresponding to the power-source voltage VDD remains at the one of the data accumulation nodes SN, /SN to which H data is written. Since the present embodiment has connected the charge supply capacitors 15, 16 in parallel to the memory cell capacitors 13, 14 between the respective data accumulation nodes SN, /SN and the capacitor plate line CPV1, the resulting structure has an additional large capacitance compared with the diffusion capacitance of the source region of the memory cell transistor. Therefore, the ferroelectric memory device according to the present embodiment can retain large residual charge over an elongated period after the time t14, compared with the ferroelectric memory device according to the first embodiment. Since the amount of charge accumulated at the data accumulation nodes SN, /SN of the ferroelectric capacitor can be increased with the charge of the charge supply capacitors 15, 16, it becomes possible to cause sufficient polarization inversion in the ferroelectric capacitor by using larger residual charge. This indicates excellent low-voltage and high-speed performance.

The capacitance of each of the charge supply capacitors 15, 16 is set to a value which allows the accumulation of the amount of charge required for, e.g., polarization inversion in the memory cell capacitors 13, 14. Each of the charge supply capacitors 15, 16 may be composed of a so-called MIM structure in which an insulating film such as a silicon oxide film is sandwiched between polysilicon electrodes or, alternatively, it may also be composed of a ferroelectric capacitor.

If each of the charge supply capacitors 15, 16 is configured to have a ferroelectric film similarly to the memory cell capacitors 13, 14 for data accumulation, there can be achieved the effects of a large capacity and a smaller area compared with a normal insulating-film capacitor and of a reduced influence exerted by the capacitance values of the charge supply capacitors 15, 16 on the characteristics of the charge supply capacitors 13, 14 because variations in the characteristics of the memory device resulting from the manufacturing process are on the same level as variations in the characteristics of the memory cell capacitors 13, 14.

In the case where each of the charge supply capacitors 15, 16 is configured to have a normal MIM structure in which a normal insulating film is sandwiched between polysilicon electrodes, the required amount of charge can be set simply with a voltage since the amount of accumulated charge exhibits a simple linear characteristic with respect to voltages at both terminals.

Although the present embodiment has provided a fixed voltage on the capacitor plate line CPV1, it is also possible to control the amount of accumulated charge by controlling the capacitor plate line CPV1, which will be described in a seventh embodiment.

Embodiment 7

Figure 10:
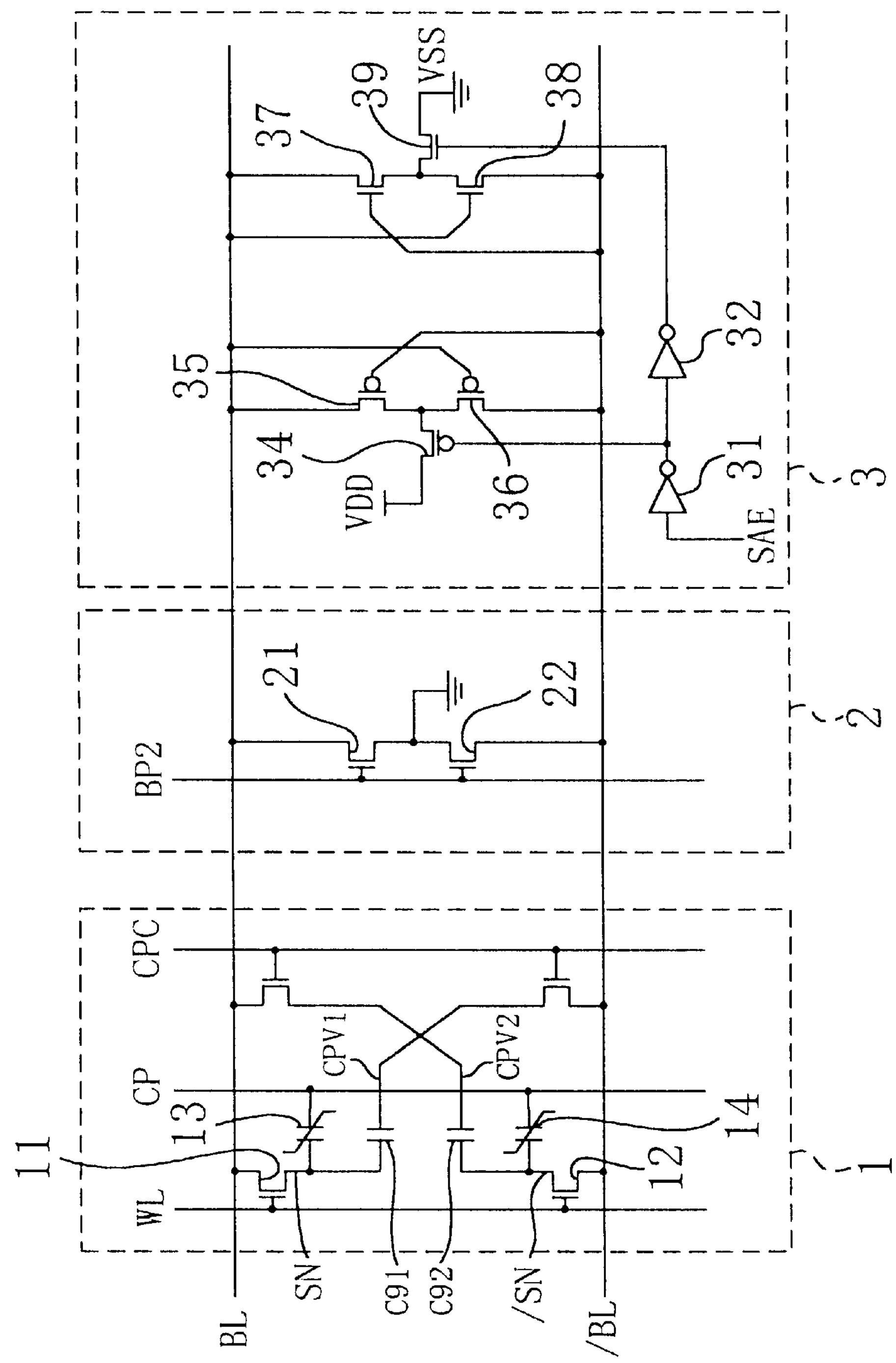
FIG. 10 is an electric circuit diagram showing the structure of a principal portion of a ferroelectric memory device according to a seventh embodiment of the present invention.

FIG. 10 is an electric circuit diagram showing the structure of a ferroelectric memory device according to the seventh embodiment. In the ferroelectric memory device according to the present embodiment, two capacitor plate lines CPV1, CPV2 connected to the respective bit lines BL, /BL are provided. In addition, the charge supply capacitors 15, 16 are interposed between the respective data accumulation nodes SN, /SN and the respective capacitor plate lines CPV1, CPV2 in the memory cell 1. Moreover, respective NMOS transistors 17, 18 are interposed between the respective capacitor plate lines CPV1, CPV2 and the respective bit lines /BL, BL so that the NMOS transistors 17, 18 have respective gates controlled by a signal on a control signal line CPC. As for the other components, they are the same as those of the conventional ferroelectric memory device shown in FIG. 17, which has already been described.

The ferroelectric memory device according to the present embodiment is obtained by controlling the voltages at the ones of the both electrodes of the charge supply capacitors 15, 16 in opposing relation to the other electrodes connected to the data accumulation nodes SN, /SN in the sixth embodiment such that the amount of charge accumulated in the memory cell capacitors 13, 14 is controllable. Although it is possible to effectively invert polarization by increasing the amount of accumulated charge under control based on a signal from a control circuit, the present embodiment has adopted a structure in which the bit lines BL, /BL connected to the accumulation nodes SN, /SN are connected in complementary relation to each other via transistors which are turned ON and OFF in response to a switch control signal on the control signal line CPC.

Figure 11:
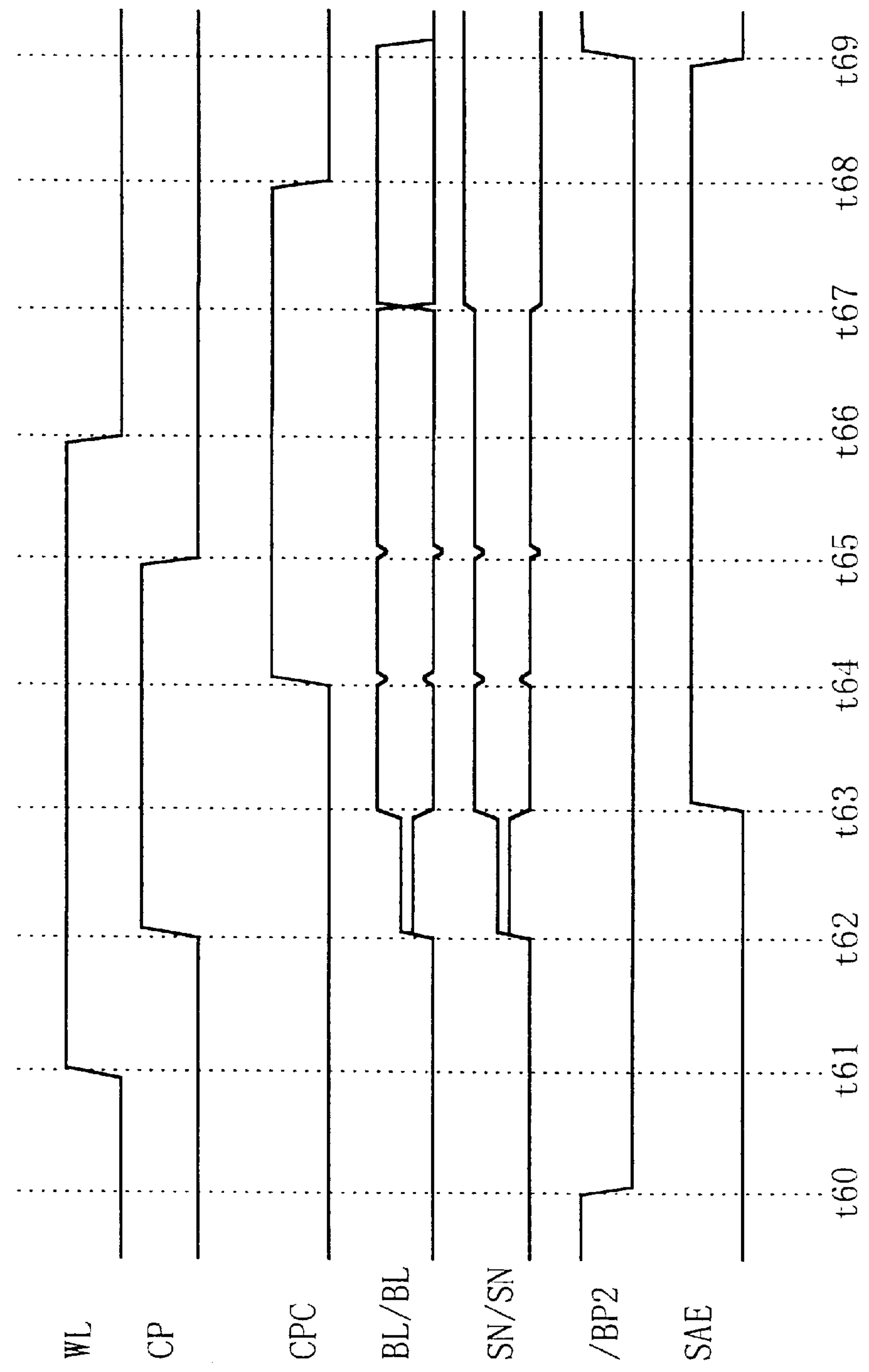
FIG. 11 is an operation timing chart for the ferroelectric memory device according to the seventh embodiment.

A description will be given to a read operation and a write operation each performed in the ferroelectric memory device according to the present embodiment with reference to the operation timing chart of FIG. 11.

First, when the logic signal L is supplied to the bit-line voltage control signal line BP2 at a time t60, the NMOS transistors 21, 22 are turned OFF in the bit-line voltage control circuit 2 to stop the precharging of the bit lines BL, /BL to the ground voltage VSS.

Next, when the logic signal H is supplied to the word line WL at a time t61, the memory cell transistors 11, 12 are turned ON so that the respective voltages at the data accumulation nodes SN, /SN become equal to the respective voltages on the bit lines BL, /BL.

Next, the logic signal H is supplied to the cell plate line CP at a time t62 so that data is read from the memory cell capacitors 13, 14 each composed of the ferroelectric film onto the bit lines BL, /BL.

Next, the logic signal H is supplied to the sense-amp control signal line SAE at a time t63 to operate the sense amp circuit 3 so that the potential difference between the data signals on the bit lines BL, /BL is amplified to the potential difference between the power-source voltage VDD and the ground voltage VSS.

Next, the logic signal H is supplied to the capacitor plate control signal line CPC at a time t64 to fix respective potentials on the capacitor plate lines CPV1, CPV2 connected to the charge supply capacitors 15, 16.

Next, the logic signal L is supplied to the cell plate line CP at a time t65 such that the H data write operation is performed with respect to the memory cell capacitors 13, 14.

Next, when the logic signal L is supplied to the word line WL at a time t66, the memory cell transistors 11, 12 are turned OFF. Since the memory cell transistors had been in the ON state till they were turned ON, the charge corresponding to the power-source voltage VDD remains at the one of the data accumulation nodes SN, /SN connected to the memory cell capacitor in which H data is written.

Next, data determined by the respective levels of the logic voltages on the bit lines BL, /BL is inverted at a time t67. The operation inverts the ordering relation between the potentials on the capacitor plate lines CPV1, CPV2 and a higher voltage is applied to the one of the data accumulation nodes SN, /SN connected to the memory cell capacitor in which H data is written, while a lower voltage is applied to the other of the data accumulation nodes SN, /SN connected to the memory cell capacitor in which L data is written, resulting in a state in which polarization inversion can be performed continuously in the ferroelectric capacitor by using residual charge.

Next, the logic signal L is supplied to the capacitor plate control signal line CPC at a time t68 to turn OFF the NMOS transistors 18, 19 so that the capacitor plate lines CPV1, CPV2 are electrically disconnected from the bit lines /BL, BL.

Thereafter, the logic signal L is supplied to the amp control signal line SAE to stop the sense amp circuit 3, while the precharging of the bit lines BL, /BL to the ground voltage VSS is initiated by supplying the logic signal H to the bit-line voltage control signal line BP2, thereby providing the logic voltage L on each of the bit lines BL, /BL.

The present embodiment enables a more effective write operation by using residual charge than the sixth embodiment and a high-speed device operation.

Although the capacitor plate lines CPV1, CPV2 have been controlled by the signals on the bit lines in the present embodiment, there may also be adopted a circuit configuration using a control signal line other than the bit lines to perform control operation.

Embodiment 8

Figure 12:
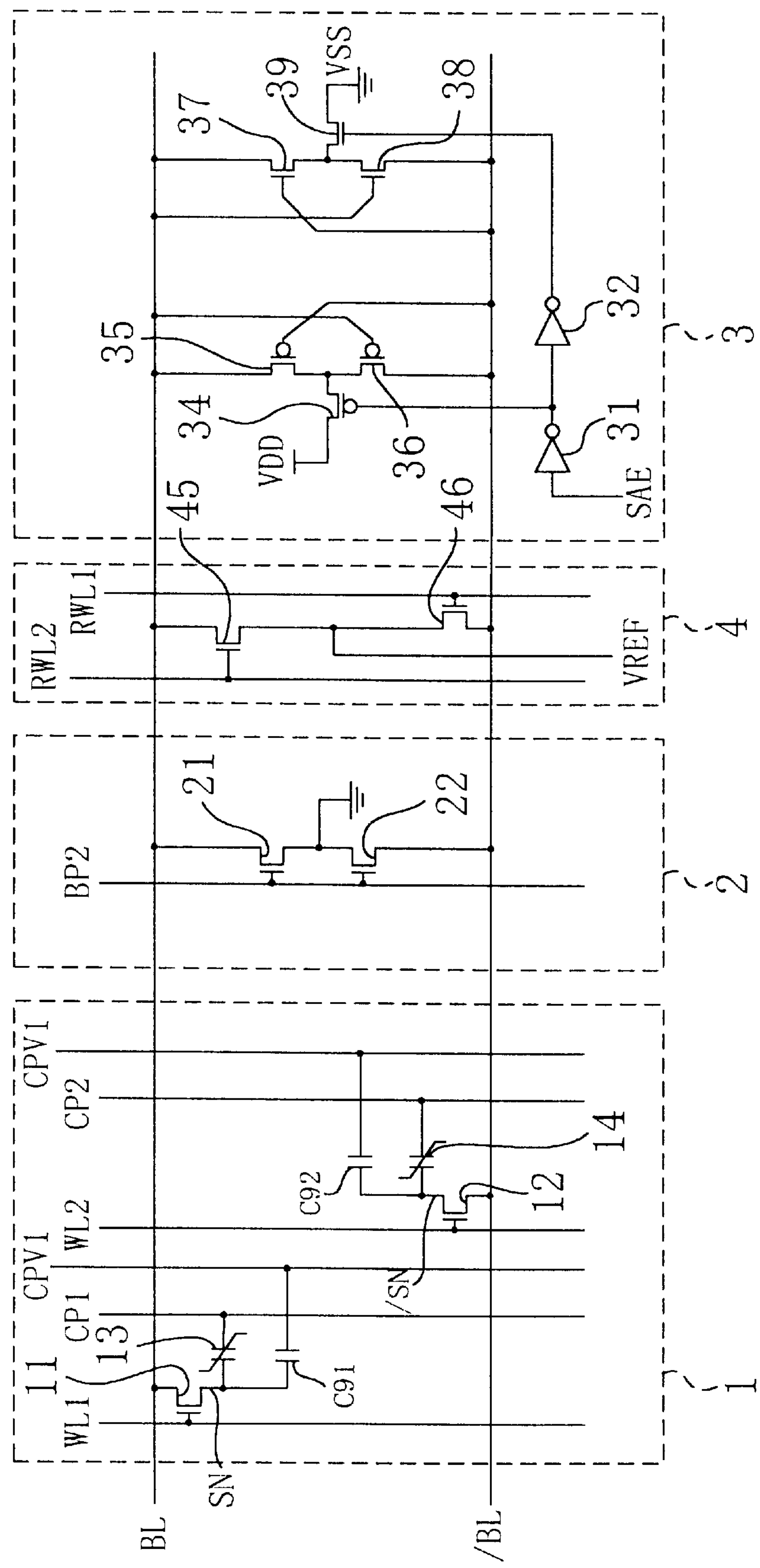
FIG. 12 is an electric circuit diagram showing the structure of a principal portion of a ferroelectric memory device according to an eighth embodiment of the present invention.

FIG. 12 is an electric circuit diagram showing the structure of a ferroelectric memory device according to an eight embodiment of the present invention. In a ferroelectric memory device according to the present embodiment, two word lines WL1, WL2 and the two capacitor plate lines CPV1, CPV2 are provided. In the memory cell 1, the memory cell transistor 11 and the memory cell capacitor 13 are interposed between the bit line BL and the capacitor plate line CPV1, while the memory cell transistor 12 and the memory cell capacitor 14 are interposed between the bit line /BL and the capacitor plate line CPV2. There is further provided a reference voltage supply circuit 4 for supplying a reference voltage to the bit lines BL, /BL. The reference voltage supply circuit 4 is composed of: two NMOS transistors 45, 46; two reference word lines RWL1, RWL2 for controlling the ON-OFF switching of each of the NMOS transistors 45, 46; and a reference voltage supply line VREF for supplying the reference voltage. In short, the reference voltage supply circuit 4 is so constituted as to individually supply the reference voltage to the bit lines BL, /BL through the ON-OFF switching of the NMOS transistors 45, 46. As for the other components, they are the same as those of the conventional ferroelectric memory device shown in FIG. 17, which has already been described.

Various circuits have been known as examples of the circuit for generating the reference voltage, of which any may be used. For example, the circuit disclosed in U.S. Pat. No. 5,467,302 can be used as the circuit for generating the reference voltage.

In contrast to the foregoing ferroelectric memory device according to the sixth or seventh embodiment in which complementary data is stored in the two memory cell capacitors and used as 1-bit data, 1-bit data is stored in one memory cell capacitor in the ferroelectric memory device according to the present embodiment. To implement the arrangement, a data signal is read from the memory cell onto one bit line BL (or /BL), while the reference voltage is supplied from the reference voltage supply circuit 4 onto the other bit line /BL (or BL) pairing up with the bit line BL (or /BL) onto which the data signal is read. The data signal read from the memory cell is compared with the reference voltage and amplified by the sense amp circuit 3.

In the present embodiment, the additional capacitors 15, 16 connected in parallel to the memory cell capacitors 13, 14 operate to exert the same effects as in the sixth or seventh embodiment. Thus, the ferroelectric memory device according to the present embodiment, which has been configured to store 1-bit data in one memory cell capacitor, can exert the same effects as described in the sixth or seventh embodiment.

Embodiment 9

Figure 13:
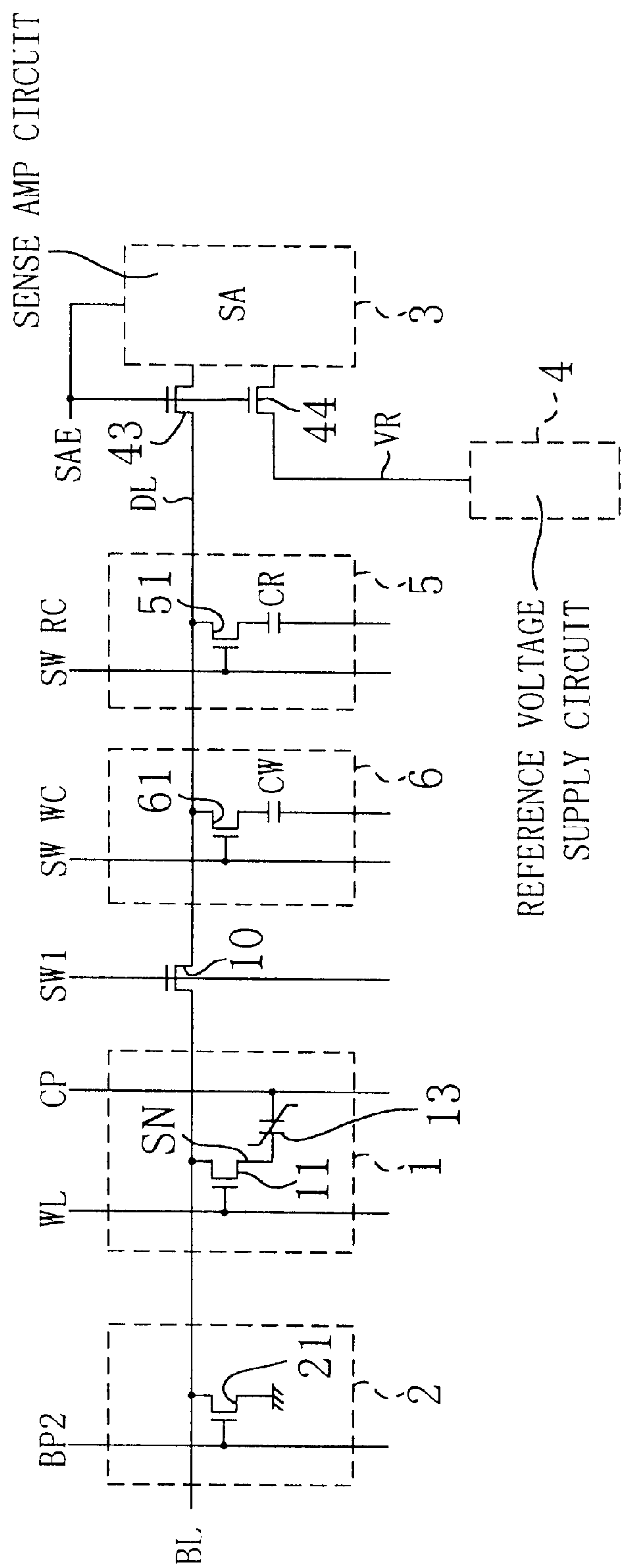
FIG. 13 is an electric circuit diagram showing the structure of a principal portion of a ferroelectric memory device according to a ninth embodiment of the present invention.

FIG. 13 is an electric circuit diagram showing the structure of a ferroelectric memory device according to a ninth embodiment of the present invention. In the ferroelectric memory device shown in FIG. 13, the bit line BL is connected to a data line DL via a transistor 10 having a gate for receiving a switch control signal SW1. The memory cell 1 and the bit-line voltage control circuit 2 are connected to the bit line BL, while a read capacitor control circuit 5 and a write capacitor control circuit 6 are connected to the data line DL. The data line DL is connected to the sense amp circuit 3 via a transistor 43 having a gate for receiving the signal from the sense-amp control signal line SAE.

In the memory cell 1, the memory cell transistor 11 and the memory cell capacitor 13 as the ferroelectric capacitor are connected in series between the bit line BL and the cell plate line CP. A transistor 21 having a gate for receiving a signal from the bit-line voltage control signal line BP2 is disposed in the bit-line voltage control circuit 2. The read capacitor control circuit 5 consists of a read capacitor CR and a transistor 51 having a gate for receiving a signal from a switch control signal line SWRC. The write capacitor control circuit 6 consists of a write capacitor CW and a transistor 61 having a gate for receiving a signal from a switch control signal line SWWC. A reference voltage signal line VR connected to the reference voltage generating circuit 4 to form a pair with the data DL is connected to the sense amp circuit 3 via a transistor 44. The sense-amp control signal line SAE is connected to the gate of the transistor 44.

The sense amp circuit 3 and the reference voltage supply circuit 4 can be composed of the structures described above in the individual embodiments.

In contrast to the sixth to eighth embodiments in which the charge supply capacitor for performing a write operation by using residual charge is disposed in each memory cell, the present embodiment is characterized in that the write capacitor control circuit 6 provided with a write capacitor CW which can be used in common by the individual memory cells is provided and the write capacitor CW is connected to the bit line via the transistor 61. As a result, a polarization in the memory cell capacitor 21 is inverted by using charge temporarily accumulated in the write capacitor CW. The arrangement allows necessary and sufficient polarization inversion to be performed in the ferroelectric capacitor and implements a ferroelectric memory device with excellent data retention and less degradation.

Figure 14:
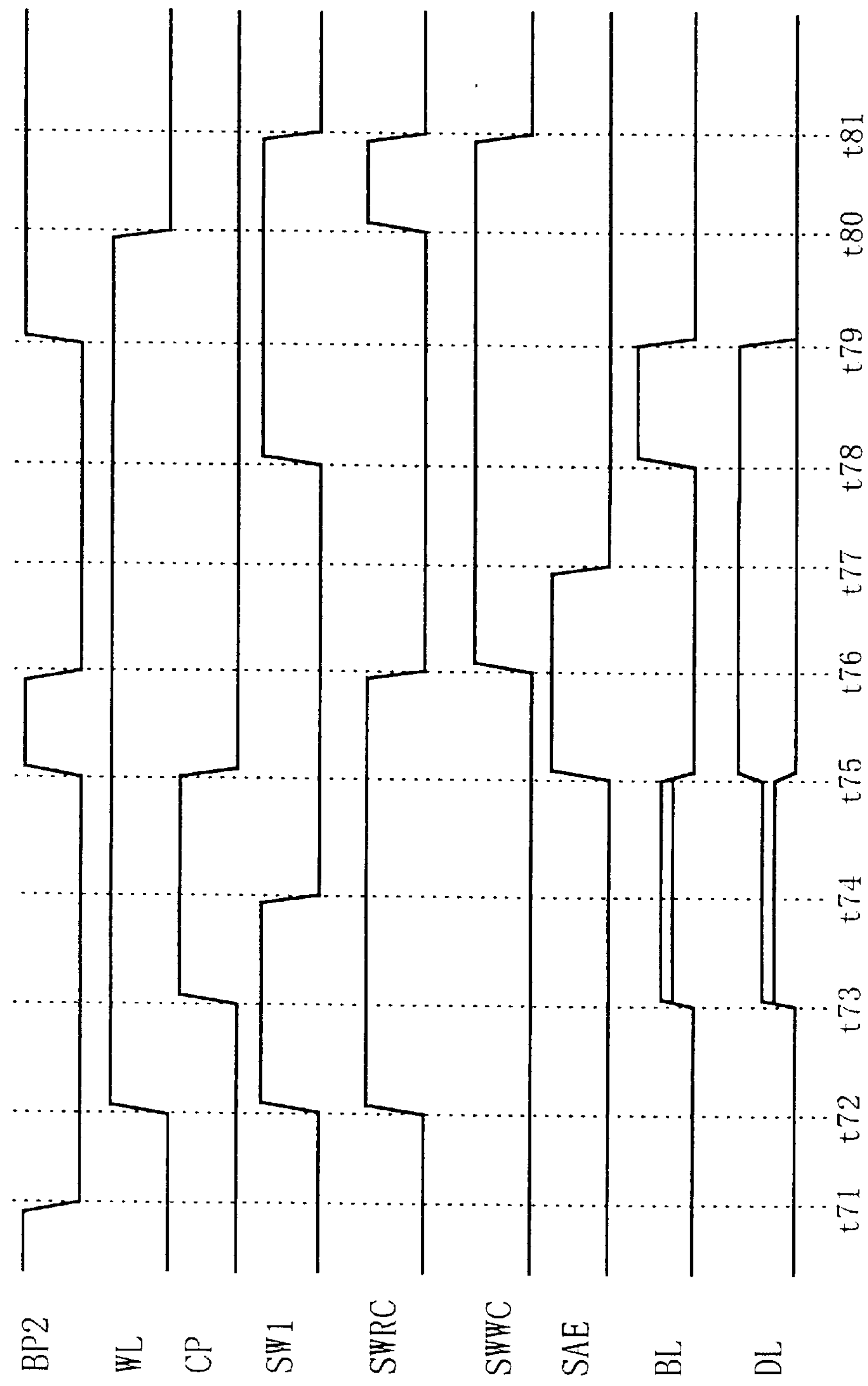
FIG. 14 is an operation timing chart for the ferroelectric memory device according to the ninth embodiment.

FIG. 14 is an operation timing chart illustrating a read operation and a rewrite operation each performed in the ferroelectric memory device according to the present embodiment.

First, when the logic signal L is supplied to the bit-line voltage control signal line BP2 at a time t71, the NMOS transistor 21 is turned OFF in the bit-line voltage control circuit 2 to stop the precharging of the bit line BL to the ground voltage VSS.

Next, when the logic signal H is supplied to the word line WL at a time t72, the memory cell transistor 11 is turned ON so that the voltage at the data accumulation node SN becomes equal to the voltage on the bit line BL. On the other hand, the logic signal H is supplied to the switch control signal line SW1 to turn ON the transistor 10 and provide an electric connection between the bit line BL and the data line DL. The logic signal H is further supplied to the switch control signal line SWRC to turn ON the transistor 51 in the read capacitor control circuit 51 and provide an electric connection between the read capacitor CR and the data line DL.

Next, the logic signal H is supplied to the cell plate line CP at a time t73 so that data is read from the memory cell capacitor 13 formed of the ferroelectric film onto the bit line BL. At the same time, the data is also read onto the data line DL since the bit line BL and the data line DL are electrically connected to each other.

Next, the logic signal L is supplied to the switch control signal line SW1 at a time t74 so that the bit line BL and the data line DL are electrically disconnected from each other.

Next, the logic signal H is supplied to the sense-amp control signal line SAE at a time t75 to operate the sense amp circuit 3 so that the potential difference between the data signals on the data line DL is amplified to the potential difference between the power-source voltage VDD and the ground voltage VSS. On the other hand, the logic signal L is supplied to the cell plate line CP, while the logic signal H is supplied to the bit-line voltage control signal line BP2 to precharge the bit line BL to the ground voltage VSS.

Next, at a time t76, the logic signal L is supplied to the switch control signal line SWRC to electrically disconnect the read capacitor CR from the data line DL, while the logic signal H is supplied to the switch control signal line SWWC to provide an electric connection between the write capacitor CW and the data line DL. On the other hand, the logic signal L is supplied to the bit-line voltage control signal line BP2 to stop the precharging of the bit line BL to the ground voltage VSS.

Next, at a time t77, the logic signal L is supplied to the sense-amp control signal line SAE to stop the operation of the sense amp circuit 3 and electrically disconnect the sense amp circuit 3 from the data line DL.

Next, at a time t78, the logic signal H is supplied to the switch control signal SW1, which provides an electric connection between the bit line BL and the data line DL and performs a polarization inverting operation in the memory cell capacitor 13 by using the charge accumulated in the write capacitor CW connected to the data line DL.

Next, the logic signal H is supplied to the bit-line voltage control signal line BP2 at a time t79 to precharge the bit line BL to the ground voltage VSS.

Next, the logic signal L is supplied to the word line WL at a time t80 to supply the logic signal H to the switch control signal line SWRC, which is the operation for extracting the charge from and resetting the read capacitor CR.

Next, the logic signal L is supplied to each of the switch control signals SW1, SWRC, and SWWC at a time t81 to electrically disconnect the bit line BL from the data line DL and stop the respective operations of the read capacitor control circuit 5 and the write capacitor control circuit 6.

It is to be noted that the read capacitor CR is for supplying a proper read voltage to the bit line BL during reading, as disclosed in Japanese Unexamined Patent Publication No. 6-342597. The present embodiment is characterized in that the write capacitor CW is provided in addition to the read capacitor CR to perform a write operation by using residual charge.

In the ferroelectric memory device according to the present embodiment, the polarization inverting operation can be performed in the ferroelectric capacitor by using residual charge, similarly to the sixth to eighth embodiments. Moreover, a write voltage higher than necessary is prevented from being applied to the ferroelectric capacitor for a long time by using residual charge in the write capacitor CR. Consequently, there are achieved the same effects as in the sixth to eighth embodiments. Moreover, since the common write capacitor CR is provided for the plurality of memory cells connected to one bit line in place of the charge supply capacitors disposed in the individual memory cells, there is implemented a ferroelectric memory device having a simple structure and occupying a reduced area.

Although the present embodiment has composed the read capacitor control circuit 5 and the write capacitor control circuit 6 of the separate and distinct circuits, it is also possible to compose the read capacitor and the write capacitor control of a single and common capacitor. The use of such a single and common capacitor leads to a simpler circuit occupying a smaller area.

Although the present embodiment has provided the reference voltage generating circuit 4 for generating the reference voltage to be supplied to the sense amp circuit 3 via the reference voltage signal line VR, the arrangement and method according to the present embodiment are also applicable to the structure for storing complementary data used in the first to seventh embodiments.

Although the present embodiment has fixed the electrodes of the read capacitor CR and of the write capacitor CW, it is also possible to increase the efficiency of a write operation using charge by exerting the same control as in the seventh embodiment.

Embodiment 10

A tenth embodiment of the present invention will be described. In contrast to the ninth embodiment in which the data line for reading and the data line for writing are composed of the single and common data line, the present embodiment has composed the data line for reading and the data line for writing of separate and discrete data lines.

Figure 15:
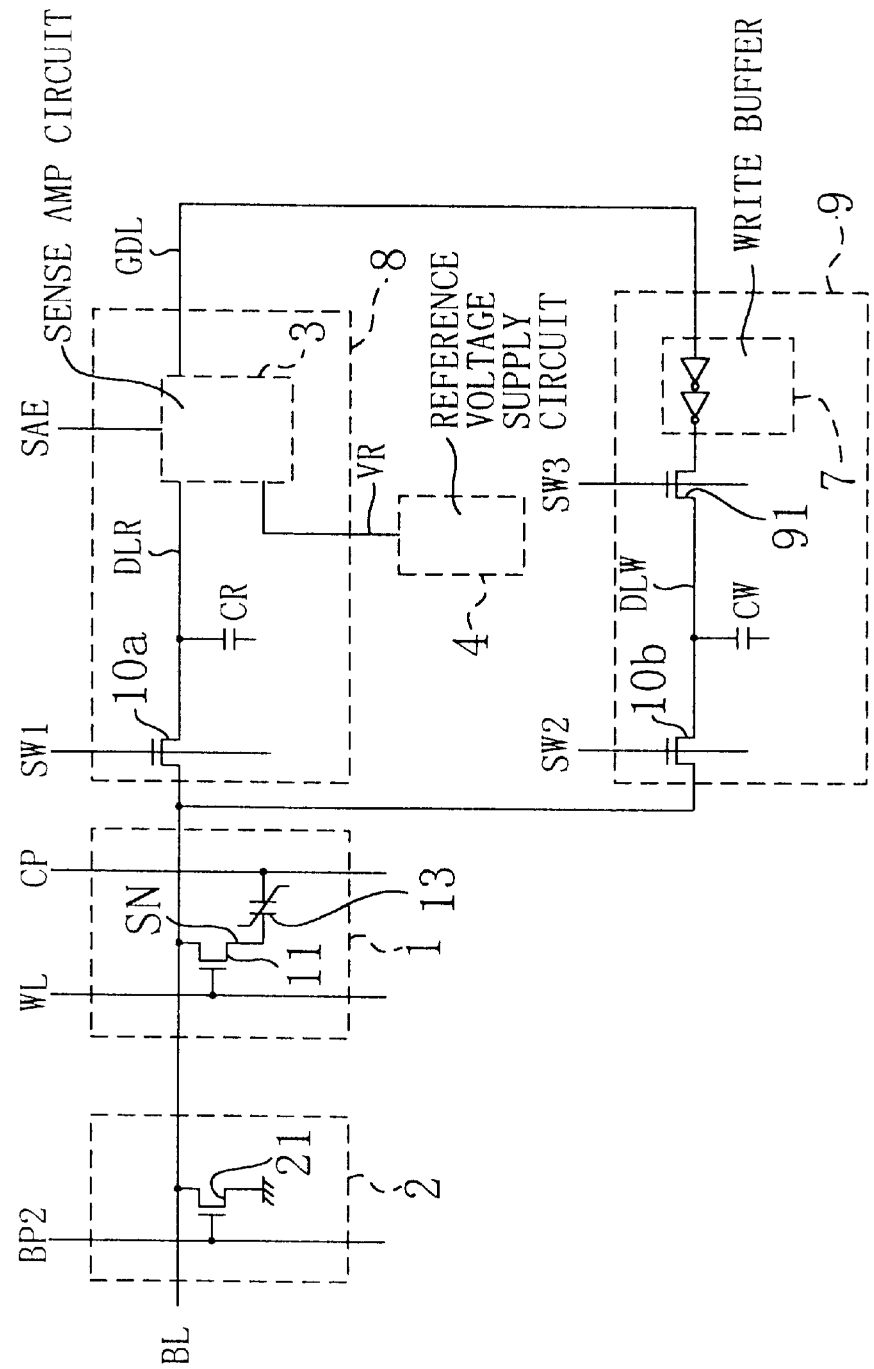
FIG. 15 is an electric circuit diagram showing the structure of a principal portion of a ferroelectric memory device according to a tenth embodiment of the present invention.

FIG. 15 is an electric circuit diagram showing the structure of a ferroelectric memory device according to the tenth embodiment. In the ferroelectric memory device shown in FIG. 15, a data line DLR for reading and a data line DLW for writing are connected to the common bit line BL. The memory cell 1 and the bit-line voltage control circuit 2 are connected to the bit line BL. A read buffer circuit 8 with the sense amp circuit 3 embedded therein is connected to the data line DLR for reading, while a write buffer circuit 9 is connected to the data line DLW for writing.

In the memory cell 1, the memory cell transistor 11 and the memory cell capacitor 13 as the ferroelectric capacitor are connected in series between the bit line BL and the cell plate line CP. The transistor 21 having a gate for receiving the signal from the bit-line voltage control signal line BP2 is disposed in the bit-line voltage control circuit 2.

In the read buffer circuit 8, a transistor 10*a* having a gate for receiving the switch control signal SW1 is interposed between the bit line BL and the data line DLR for reading. On the other hand, the read capacitor CR connected to the data line DLR for reading and the sense amp circuit 3 connected to the data line DLR for reading and controlled by the signal from the sense-amp control signal line SAE are connected to each other in the read buffer circuit 8. The reference voltage line VR connected to the reference voltage supply circuit 4 to form a pair with the data line DLR for reading is connected to the sense amp circuit 3.

In the write buffer circuit 9, a transistor 10*b* having a gate for receiving a switch control signal SW2 is connected between the bit line BL and the data line DLW for writing. The write capacitor CW connected to the data line DLW for writing and a write buffer 7 are also disposed in the write buffer circuit 9. The write buffer 7 is connected to the data line DLW for writing via a transistor 91 having a gate for receiving a switch control signal line SW3. The write buffer 7 is electrically connectable to the sense amp circuit 3 via a global data line GDL for data transfer.

The sense amp circuit 3 and the reference voltage supply circuit 4 can be composed of the structures described above in the individual embodiments. The write buffer may also be composed of, e.g., a structure with two inverters connected in series as shown in FIG. 15. However, the write buffer is not limited to such structures but may also be composed of another structure.

Figure 16:
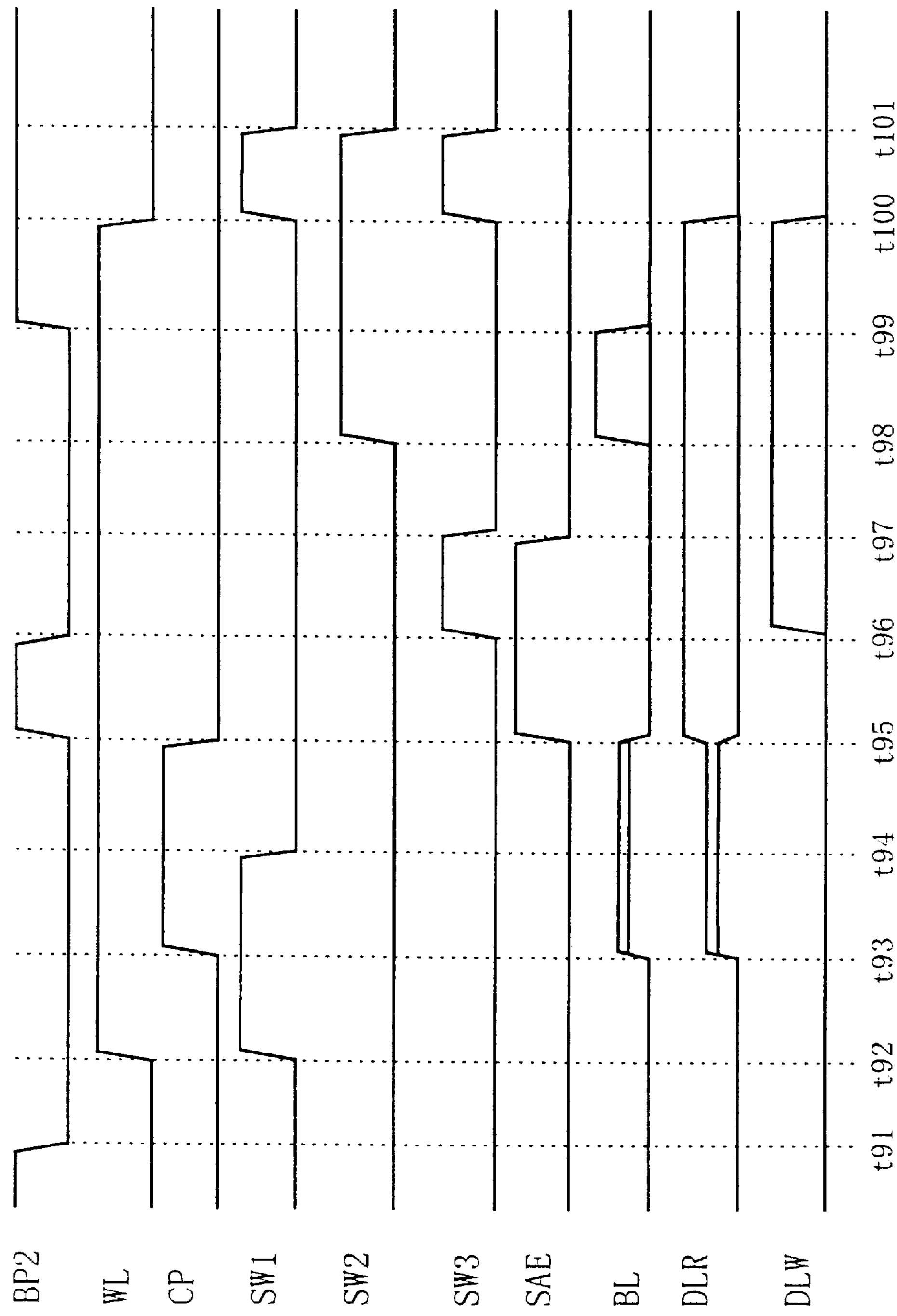
FIG. 16 is an operation timing chart for the ferroelectric memory device according to the tenth embodiment.

FIG. 16 is an operation timing chart illustrating a read operation and a rewrite operation each performed in the ferroelectric memory device according to the present embodiment.

First, when the logic signal L is supplied to the bit-line voltage control signal line BP2 at a time t81, the NMOS transistor 21 is turned OFF in the bit-line voltage control circuit 2 to stop the precharging of the bit line BL to the ground voltage VSS.

Next, when the logic signal H is supplied to the word line WL at a time t82, the memory cell transistor 11 is turned ON so that the voltage at the data accumulation node SN becomes equal to the voltage on the bit line BL. On the other hand, the logic signal H is supplied to the switch control signal line SW1 to turn ON the transistor 10*a* and provide an electric connection between the bit line BL and the data line DLR for reading.

Next, the logic signal H is supplied to the cell plate line CP at a time t83 to read data from the memory cell capacitor 13 formed of the ferroelectric film onto the bit line BL. Since the bit line BL and the data line DLR for reading are electrically connected to each other, data is also read onto the data line DL.

Next, the logic signal L is supplied to the switch control signal line SW1 at a time t84 to electrically disconnect the bit line BL from the data line DLR for reading.

Next, the logic signal H is supplied to the sense-amp control signal line SAE at a time t85 to operate the sense amp circuit 3 so that the potential difference between the data signals on the data line DL to the potential difference between the power-source voltage VDD and the ground voltage VSS. In the event of using a sense amplifier configured to input the potential on the bit line only to the gate of the transistor, it is unnecessary to supply the logic signal L to the switch control signal line SW at this stage. On the other hand, the logic signal L is supplied to the cell plate line CP and the logic signal H is supplied to the bit-line voltage control signal line BP to precharge the bit line BL to the ground voltage VSS.

Next, when the logic signal H is supplied to the switch control signal SW3 at a time t86, data is supplied from the sense amp circuit 3 to the data line DLW for writing via the global data line GDL and the write buffer circuit 7. The logic signal L is supplied to the switch control signal line SW1 to electrically disconnect the read capacitor CR from the data line DLR for reading, while the logic signal H is supplied to the switch control signal line SW2 to provide an electric connection between the write capacitor CW and the data line DLW for writing. The logic signal L is also supplied to the bit-line voltage control signal line BP2 to stop the precharging of the bit line BL to the ground voltage VSS.

Next, the logic signal L is supplied to the sense-amp control signal line SAE at a time t87 to stop the operation of the sense amp circuit 3 and electrically disconnect the sense amp circuit 3 from the data line DLW for writing.

Next, the logic signal H is supplied to the switch control signal line SW2 at a time t88. This places the bit line BL and the data line DLW for writing in an electrically connected state so that a polarization inverting operation is performed in the memory cell capacitor 13 by using the charge accumulated in the write capacitor CW via the data line DLW for writing.

Next, the logic signal H is supplied to the bit-line voltage control signal line BP2 at a time t89 to precharge the bit line BL to the ground voltage VSS.

Next, the logic signal L is supplied to the word line WL at a time t90 to supply the logic signal H to the switch control signal line SW1, SW2. This is the operation for extracting the charge from and resetting the read capacitor CR and the write capacitor CW.

Next, the logic signal L is supplied to each of the switch control signal line SW1, SW2, and SW3 to electrically disconnect the bit line BL from each of the data lines DLR, DLW and stop the operations of the read buffer circuit 8 and the write buffer circuit 9.

In the present embodiment also, the use of the residual charge in the write capacitor CR prevents a write voltage higher than necessary from being applied to the ferroelectric capacitor for a long time. Consequently, the present embodiment can exert the same effects as the sixth to eighth embodiments. Since the common write capacitor CR is provided for the plurality of memory cells connected to one bit line in place of the charge supply capacitors disposed in the individual memory cells, there can be implemented a ferroelectric memory device having a simple structure and occupying a reduced area. As a result, the present embodiment can exert the same effects as the ninth embodiment.

Unlike the ninth embodiment in which the data line for reading and the data line for writing are composed of the single and common data line, the present embodiment has composed the data line for reading and the data line for writing of separate and discrete data lines. The arrangement prevents a voltage from being supplied to the bit line in the case of using, e.g., a sense amp circuit configured to input the potential on the bit line only to the gate of the transistor, so that it is no more necessary to provide a bit line and a data line for reading which are separate from each other, resulting in shorter access time.

Although the present embodiment has adopted the 1T1C configuration, i.e., the arrangement using the reference voltage VR, the present embodiment is also applicable to the 2T1C configuration and to the 2T2C configuration for storing complementary data used in the first to seventh embodiments. Although the present embodiment has fixed the electrodes of the read capacitor CR and the write capacitor CW, it is also possible to increase the efficiency of a write operation using charge by exerting the same control as in the seventh embodiment.

It is also possible to select one from the group of first to fifth embodiments and one from the group of fifth to tenth embodiments and combine the selected two embodiments.

It is to be noted that the ferroelectric memory device including a structure embodying the principle of the invention, which is for performing polarization inversion in the ferroelectric capacitor by using residual charge, is included in the present invention.

INDUSTRICAL APPLICABILITY

The ferroelectric memory device according to the present invention is usable as, e.g., a semiconductor memory device to be accommodated in various electronic equipment and particularly suitable for use in a non-volatile RAM.

What is claimed is:

1. A ferroelectric memory device comprising:

a memory cell;

a bit line connected to said memory cell;

a ferroelectric capacitor provided in said memory cell and composed of first and second electrodes and a ferroelectric film sandwiched between said first and second electrodes;

a memory cell transistor provided in said memory cell to be interposed between said bit line and said first electrode of said ferroelectric capacitor;

a cell plate line connected to said second electrode of said ferroelectric capacitor; and a control means for turning OFF said memory cell transistor with an electric field for polarizing said ferroelectric film provided between said first and second electrodes of said ferroelectric capacitor.

2. A ferroelectric memory device according to claim 1, further comprising:

another bit line connected to said memory cell;

another ferroelectric capacitor; and another memory cell transistor interposed between said other bit line and said other ferroelectric capacitor.

3. A ferroelectric memory device according to claim 1, wherein said control means turns OFF said memory cell transistor with a voltage on said bit line being higher than a voltage on said cell plate line and the difference voltage between said voltage on said bit line and said voltage on said cell plate line being lower than a power-source voltage.

4. A ferroelectric memory device according to claim 2, wherein said control means turns OFF said memory cell transistor with a voltage on said bit line being higher than a voltage on said cell plate line and the difference voltage between said voltage on said bit line and said voltage on said cell plate line being lower than a power-source voltage and turns OFF said other memory cell transistor with a voltage on said other bit line being lower than the voltage on said cell plate line.

5. A ferroelectric memory device according to claim 4, wherein said control means lowers the voltage on said cell plate line after turning OFF said other memory cell transistor.

6. A ferroelectric memory device according to claim 4, wherein said control means lowers the voltage on said cell plate line after placing said other bit line in a floating state.

7. A ferroelectric memory device according to claim 4, wherein said control means turns OFF said other memory cell transistor with a voltage on said other bit line being lower than the voltage on said cell plate line by the value of a built-in voltage.

8. A ferroelectric memory device comprising:

a memory cell;

a bit line connected to said memory cell;

a ferroelectric capacitor provided in said memory cell and composed of first and second electrodes and a ferroelectric film sandwiched between said first and second electrodes;

a memory cell transistor provided in said memory cell to be interposed between said bit line and said first electrode of said ferroelectric capacitor;

a cell plate line connected to said second electrode of said ferroelectric capacitor; and a charge supply capacitor composed of first and second electrodes and a dielectric film sandwiched between said first and second electrodes, the first electrode of said charge supply capacitor and said first electrode of said ferroelectric capacitor being connected to each other.

9. A ferroelectric memory device according to claim 8, wherein said first and second electrodes of said charge supply capacitor are composed of polysilicon.

10. A ferroelectric memory device according to claim 8, wherein said dielectric film of said charge supply capacitor is composed of a ferroelectric material.

11. A ferroelectric memory device according to claim 8, wherein said second electrode of said charge supply capacitor is configured to receive a fixed voltage.

12. A ferroelectric memory device according to claim 8, further comprising control means for inverting the polarity of a voltage at the second electrode of said charge supply capacitor with the first electrode of said charge supply capacitor being connected to the first electrode of said ferroelectric capacitor.

13. A ferroelectric memory device according to claim 8, further comprising:

another bit line connected to said memory cell;

another ferroelectric capacitor;

another memory cell transistor interposed between said other bit line and said other ferroelectric capacitor; and another charge supply capacitor, the first electrode of said other charge supply capacitor and said first electrode of said other ferroelectric capacitor and said first electrode of said other ferroelectric capacitor being connected to each other.

14. A ferroelectric memory device according to claim 13, further comprising a common line connected to the second electrode of said charge supply capacitor and to the second electrode of said other charge supply capacitor.

15. A ferroelectric memory device according to claim 13, further comprising first and second lines connected to the respective second electrodes of said charge supply capacitor and said other charge supply capacitor.

16. A ferroelectric memory device according to claim 15, wherein said first line is connected to said other bit line and said second line is connected to said bit line, said ferroelectric memory device further comprising:

a first switching transistor provided to intervene said first line; and a second switching transistor provided to intervene said first line.

17. A ferroelectric memory device according to claim 8, further comprising a data line connected to said bit line, wherein said first electrode of said charge supply capacitor is connected to said data line and a connection is provided between said first electrode of said charge supply capacitor and said first electrode of said ferroelectric capacitor during writing.

18. A ferroelectric memory device according to claim 17, further comprising a capacitor for reading having first and second electrodes and a dielectric film sandwiched between said first and second electrodes, wherein said first electrode of said capacitor for reading is connected to said data line and a connection is provided between said first electrode of said capacitor for reading and said first electrode of said ferroelectric capacitor during reading.

19. A ferroelectric memory device according to claim 17, further comprising:

a capacitor for reading having first and second electrodes and a ferroelectric film sandwiched between said first and second electrodes; and another data line connected to said first electrode of said capacitor for reading, wherein a connection is provided between said first electrode of said charge supply capacitor and said first electrode of said ferroelectric capacitor during writing, while a connection is provided between said first electrode of said capacitor for reading and said first electrode of said ferroelectric capacitor during reading.

20. A ferroelectric memory device according to claim 17, wherein said charge supply capacitor is connected to said first electrode of said ferroelectric capacitor during writing, while said charge supply capacitor is used as capacitance for adjusting the capacitance of the bit line during reading.

21. A ferroelectric memory device according to claim 17, further comprising:

a write buffer circuit connected to said data line and containing said charge supply capacitor;

a data line for reading connected to said bit line via a transistor; and a sense amplifier circuit connected to said data line for reading.

22. A ferroelectric memory device according to claim 21, further comprising a capacitor for reading composed of first and second electrodes and a dielectric film sandwiched between said first and second electrodes, said first electrode being used as said data line for reading.

23. A ferroelectric memory device according to claim 8, further comprising control means for stopping the supply of a voltage to each of said first and second electrodes with charge for polarizing said ferroelectric film remaining at said first and second electrodes of said ferroelectric capacitor.

24. A method of driving a ferroelectric memory device having a memory cell internally provided with a ferroelectric capacitor composed of first and second electrodes and a ferroelectric film sandwiched between said first and second electrodes and with a switching transistor connected to said first electrode of said ferroelectric capacitor, said method comprising:

a first step of turning ON said switching transistor to provide an electric field between the first and second electrodes of said ferroelectric capacitor via said switching transistor; and a second step of turning OFF said switching transistor with said electric field provided.

25. A method of driving a ferroelectric memory device according to claim 24, wherein said second step includes causing said charge to remain such that an electric field less intense than and having the same polarity as the electric filed supplied to said ferroelectric film in said first step is supplied to said ferroelectric film.

26. A method of driving a ferroelectric memory device according to claim 24, said ferroelectric memory device further comprising:

another ferroelectric capacitor disposed in said memory cell and composed of first and second electrodes and a ferroelectric film sandwiched between said first and second electrodes; and another switching transistor connected to said first electrode of said other ferroelectric capacitor, wherein said first step includes applying to the first electrode of said ferroelectric capacitor a voltage higher than a voltage applied to the second electrode thereof and said second step includes turning OFF said switching transistor with the voltage higher than the voltage applied to the second electrode of said ferroelectric capacitor being applied to the first electrode thereof, said method further comprising the steps of:

applying to the first electrode of said other ferroelectric capacitor a voltage lower than a voltage applied to the second electrode thereof; and turning OFF said other switching transistor with the voltage lower than the voltage applied to the second electrode of said other ferroelectric capacitor being applied to the first electrode thereof.

* * * * *